(12) United States Patent
Buot et al.

(10) Patent No.: US 12,667,029 B2
(45) Date of Patent: Jun. 23, 2026

(54) PACKAGE COMPRISING A SUBSTRATE WITH POST INTERCONNECTS AND A SOLDER RESIST LAYER HAVING A CAVITY

(71) Applicant: QUALCOMM Incorporated, San Diego, CA (US)

(72) Inventors: Joan Rey Villarba Buot, Escondido, CA (US); Zhijie Wang, San Diego, CA (US); Hong Bok We, San Diego, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 171 days.

(21) Appl. No.: 17/579,434

(22) Filed: Jan. 19, 2022

(65) Prior Publication Data

US 2023/0230908 A1     Jul. 20, 2023

(51) Int. Cl.
H10W 70/65 (2026.01)
H10W 20/44 (2026.01)
(Continued)

(52) U.S. Cl.
CPC ..... H10W 90/701 (2026.01); H10W 20/4424 (2026.01); H10W 70/611 (2026.01);
(Continued)

(58) Field of Classification Search
CPC ............... H01L 23/4981; H01L 23/533; H01L 23/5386; H01L 24/14
See application file for complete search history.

(56) References Cited

U.S. PATENT DOCUMENTS 8,766,424 B2    7/2014    Chung
8,952,532 B2    2/2015    Zheng et al.
(Continued)

FOREIGN PATENT DOCUMENTS

EP        1962342 A1    8/2008
JP        4396839 B2    1/2010
TW      200913213 A    3/2009

OTHER PUBLICATIONS

International Search Report and Written Opinion—PCT/US2023/010230—ISA/EPO—Apr. 21, 2023.
Taiwan Search Report—TW112100372—TIPO—Jan. 25, 2026.

*Primary Examiner* — Trang Q Tran
(74) *Attorney, Agent, or Firm* — Loza & Loza, LLP

(57)     ABSTRACT

A package comprising a first substrate, a first integrated device coupled to the first substrate, and a second substrate, and a plurality of solder interconnects coupled to the first substrate and the second substrate. The first substrate comprises at least one first dielectric layer; a first plurality of interconnects, wherein the first plurality of interconnects include a first plurality of post interconnects; and a first solder resist layer coupled to a first surface of the first substrate. The second substrate comprises a first surface and a second surface; at least one second dielectric layer; a second plurality of interconnects, wherein the second plurality of interconnects comprises a second plurality of post interconnects; and a second solder resist layer coupled to the second surface of the second substrate. The second surface of the second substrate faces the first substrate. The second solder resist layer includes a cavity.

18 Claims, 18 Drawing Sheets

*CROSS SECTIONAL PROFILE VIEW*

(51) Int. Cl.
    *H10W 70/60*     (2026.01)
    *H10W 72/00*     (2026.01)
    *H10W 72/20*     (2026.01)
    *H10W 90/00*     (2026.01)

(52) U.S. Cl.
    CPC ......... *H10W 70/65* (2026.01); *H10W 72/071*
        (2026.01); *H10W 72/20* (2026.01)

(56)         References Cited

U.S. PATENT DOCUMENTS

| | | | |
|---|---|---|---|
| 9,137,900 B2 | 9/2015 | Tanaka et al. | |
| 9,572,256 B2 * | 2/2017 | Yoshikawa | H05K 3/28 |
| 9,768,108 B2 | 9/2017 | Fu et al. | |
| 9,941,232 B2 | 4/2018 | Shiraki et al. | |
| 10,971,476 B2 | 4/2021 | Gu | |
| 2015/0102484 A1 | 4/2015 | Chen et al. | |
| 2015/0156860 A1 | 6/2015 | Lee et al. | |
| 2015/0255433 A1 | 9/2015 | Daizo et al. | |
| 2016/0358858 A1 | 12/2016 | Yamano et al. | |
| 2020/0105544 A1 | 4/2020 | Tsai et al. | |
| 2022/0068739 A1 * | 3/2022 | Son | H01L 23/4926 |
| 2022/0352110 A1 * | 11/2022 | Yim | H01L 23/49838 |

* cited by examiner

CROSS SECTIONAL PROFILE VIEW

CROSS SECTIONAL PROFILE VIEW

CROSS SECTIONAL PROFILE VIEW

CROSS SECTIONAL PROFILE VIEW

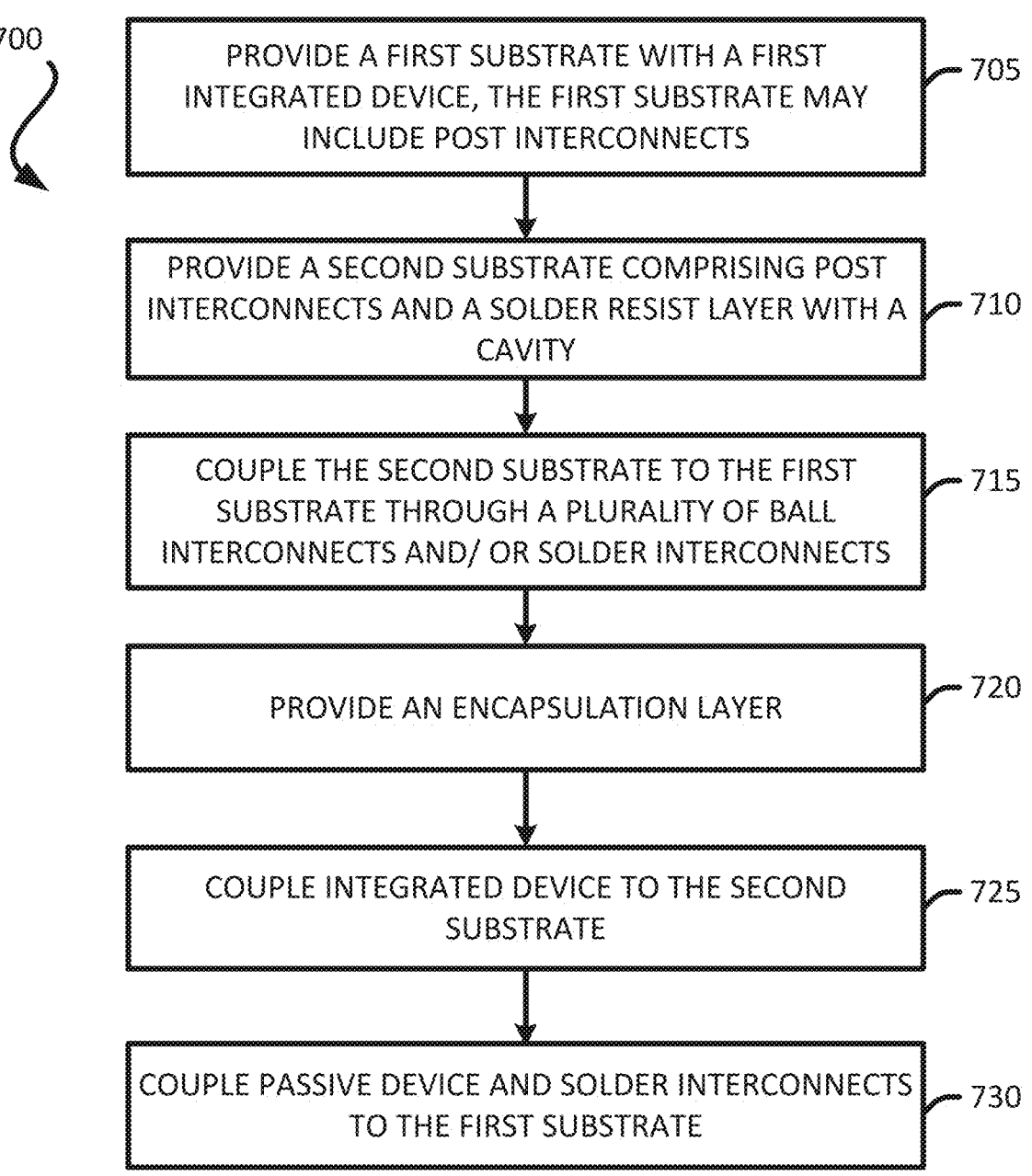

700

PROVIDE A FIRST SUBSTRATE WITH A FIRST INTEGRATED DEVICE, THE FIRST SUBSTRATE MAY INCLUDE POST INTERCONNECTS — 705

PROVIDE A SECOND SUBSTRATE COMPRISING POST INTERCONNECTS AND A SOLDER RESIST LAYER WITH A CAVITY — 710

COUPLE THE SECOND SUBSTRATE TO THE FIRST SUBSTRATE THROUGH A PLURALITY OF BALL INTERCONNECTS AND/ OR SOLDER INTERCONNECTS — 715

PROVIDE AN ENCAPSULATION LAYER — 720

COUPLE INTEGRATED DEVICE TO THE SECOND SUBSTRATE — 725

COUPLE PASSIVE DEVICE AND SOLDER INTERCONNECTS TO THE FIRST SUBSTRATE — 730

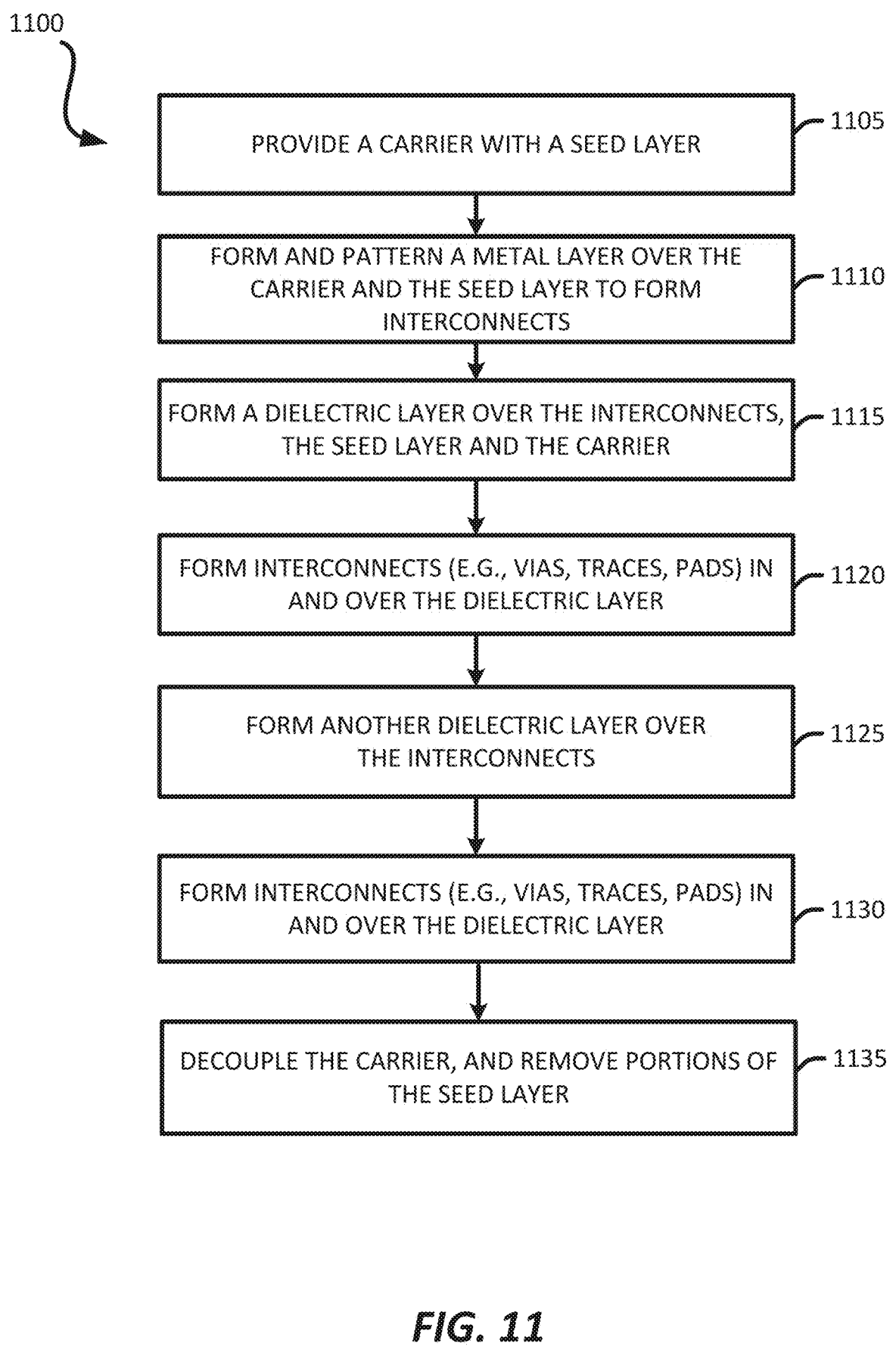

PROVIDE A CARRIER WITH A SEED LAYER — 1105

FORM AND PATTERN A METAL LAYER OVER THE CARRIER AND THE SEED LAYER TO FORM INTERCONNECTS — 1110

FORM A DIELECTRIC LAYER OVER THE INTERCONNECTS, THE SEED LAYER AND THE CARRIER — 1115

FORM INTERCONNECTS (E.G., VIAS, TRACES, PADS) IN AND OVER THE DIELECTRIC LAYER — 1120

FORM ANOTHER DIELECTRIC LAYER OVER THE INTERCONNECTS — 1125

FORM INTERCONNECTS (E.G., VIAS, TRACES, PADS) IN AND OVER THE DIELECTRIC LAYER — 1130

DECOUPLE THE CARRIER, AND REMOVE PORTIONS OF THE SEED LAYER — 1135

*FIG. 11*

PACKAGE COMPRISING A SUBSTRATE WITH POST INTERCONNECTS AND A SOLDER RESIST LAYER HAVING A CAVITY

FIELD

Various features relate to packages with substrates and integrated devices.

BACKGROUND

A package may include a substrate and integrated devices. These components are coupled together to provide a package that may perform various electrical functions. There is an ongoing need to provide better performing packages. There is also an ongoing need to reduce the overall size of the packages.

SUMMARY

Various features relate to packages with substrates and integrated devices.

One example provides a package comprising a first substrate comprising at least one first dielectric layer and a first plurality of interconnects; a first integrated device coupled to the first substrate; a second substrate; and a plurality of ball interconnects and a plurality of solder interconnects coupled to the first substrate and the second substrate. The second substrate comprises a first surface and a second surface; at least one second dielectric layer; a second plurality of interconnects, wherein the second plurality of interconnects comprises a plurality of post interconnects; and a solder resist layer coupled to the second surface of the second substrate. The second surface of the second substrate faces the first substrate. The solder resist layer includes a cavity. The cavity is located between the first integrated device and the solder resist layer. The plurality of ball interconnects and the plurality of solder interconnects are located between the first substrate and the second substrate. The plurality of ball interconnects and the plurality of solder interconnects are configured to couple the first substrate to the second substrate.

Another example provides a package comprising a first substrate, a first integrated device coupled to the first substrate, and a second substrate, and a plurality of solder interconnects coupled to the first substrate and the second substrate. The first substrate comprises at least one first dielectric layer; a first plurality of interconnects, wherein the first plurality of interconnects include a first plurality of post interconnects; and a first solder resist layer coupled to a first surface of the first substrate. The second substrate comprises a first surface and a second surface; at least one second dielectric layer; a second plurality of interconnects, wherein the second plurality of interconnects comprises a second plurality of post interconnects; and a second solder resist layer coupled to the second surface of the second substrate. The second surface of the second substrate faces the first substrate. The second solder resist layer includes a cavity. The cavity is located between the first integrated device and the second solder resist layer. The plurality of solder interconnects are located between the first substrate and the second substrate. The plurality of solder interconnects are configured to couple the first substrate to the second substrate.

Another example provide a package comprising a first substrate comprising at least one first dielectric layer and a first plurality of interconnects; a first integrated device coupled to the first substrate; a second substrate; and means for inter-substrate interconnection coupled to the first substrate and the second substrate. The second substrate comprises a first surface and a second surface; at least one second dielectric layer; a second plurality of interconnects, wherein the second plurality of interconnects comprises a plurality of post interconnects; and a solder resist layer coupled to the second surface of the second substrate. The solder resist layer includes a cavity. The cavity is located between the first integrated device and the solder resist layer. The means for inter-substrate interconnection is located between the first substrate and the second substrate. The means for inter-substrate interconnection is configured to couple the first substrate to the second substrate.

Another example provides a method comprising providing a first substrate comprising at least one first dielectric layer and a first plurality of interconnects. The method couples a first integrated device to the first substrate. The method couples a second substrate to the first substrate through a plurality of inter-substrate interconnects such that the plurality of inter-substrate interconnects is located between the first substrate and the second substrate. The second substrate comprises a first surface and a second surface; at least one second dielectric layer; a second plurality of interconnects, wherein the second plurality of interconnects comprises a plurality of post interconnects; and a solder resist layer coupled to the second surface of the second substrate. The solder resist layer includes a cavity. The cavity is located between the solder resist layer and the first integrated device.

BRIEF DESCRIPTION OF THE DRAWINGS

Various features, nature and advantages may become apparent from the detailed description set forth below when taken in conjunction with the drawings in which like reference characters identify correspondingly throughout.

FIG. 7 illustrates an exemplary flow chart of a method for fabricating a package that includes a substrate comprising post interconnects and a solder resist layer with a cavity.

FIG. 11 illustrates an exemplary flow chart of a method for fabricating a substrate that includes post interconnects and a solder resist layer with a cavity.

DETAILED DESCRIPTION

Figure 1:
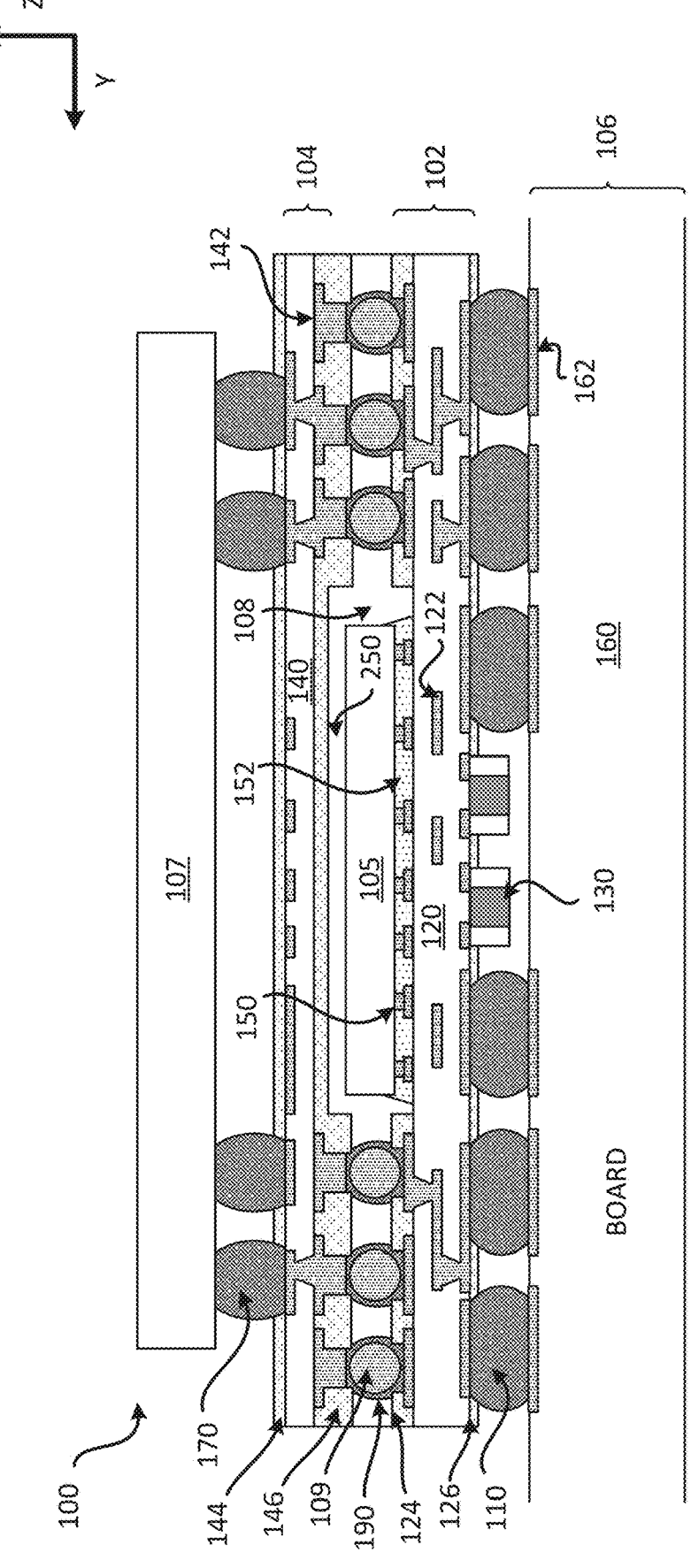
FIG. 1 illustrates an exemplary cross sectional profile view of a package that includes a substrate comprising post interconnects and a solder resist layer with a cavity.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a first substrate comprising at least one first dielectric layer and a first plurality of interconnects; a first integrated device coupled to the first substrate; a second substrate; and a plurality of ball interconnects and a plurality of solder interconnects coupled to the first substrate and the second substrate. The second substrate comprises a first surface and a second surface; at least one second dielectric layer; a second plurality of interconnects, wherein the second plurality of interconnects comprises a plurality of post interconnects; and a solder resist layer coupled to the second surface of the second substrate. The second surface of the second substrate faces the first substrate. The solder resist layer includes a cavity. The cavity is located between the first integrated device and the solder resist layer. The plurality of ball interconnects and the plurality of solder interconnects are located between the first substrate and the second substrate. The plurality of ball interconnects and the plurality of solder interconnects are configured to couple the first substrate to the second substrate. The present disclosure describes a package comprising, a first substrate, a first integrated device coupled to the first substrate, and a second substrate, and a plurality of solder interconnects coupled to the first substrate and the second substrate. The first substrate comprises at least one first dielectric layer; a first plurality of interconnects, wherein the first plurality of interconnects include a first plurality of post interconnects; and a first solder resist layer coupled to a first surface of the first substrate. The second substrate comprises a first surface and a second surface; at least one second dielectric layer; a second plurality of interconnects, wherein the second plurality of interconnects comprises a second plurality of post interconnects; and a second solder resist layer coupled to the second surface of the second substrate. The second surface of the second substrate faces the first substrate. The second solder resist layer includes a cavity. The cavity is located between the first integrated device and the second solder resist layer. The plurality of solder interconnects are located between the first substrate and the second substrate. The plurality of solder interconnects are configured to couple the first substrate to the second substrate, As will be further described below, the package provides high density interconnect routing (e.g., high density inter-substrate interconnects) between substrates, which helps provide improved package performance, while keeping the package small and thin.

Exemplary Package Comprising a Substrate with Post. Interconnects and a Solder Resist Layer with a Cavity FIG. 1 illustrates a cross sectional profile view of a package 100 that includes a substrate with post interconnects and a solder resist layer with a cavity. The package 100 may be a package on package (PoP). The package 100 is coupled to a board 106 through a plurality of solder interconnects 110. The board 106 includes at least one board dielectric layer 160 and a plurality of hoard interconnects 162. The hoard 106 may include a printed circuit board (PCB).

The package 100 includes a first substrate 102, a first integrated device 105 and an underfill 152. The first substrate 102, the first integrated device 105 and the underfill 152 may be considered part of a first package. The first integrated device 105 is coupled to a first surface (e.g., top surface) of the substrate 102, through a plurality of pillar interconnects 150. The first substrate 102 includes at least one first dielectric layer 120 and a first plurality of interconnects 122. The first integrated device 105 is coupled to the first plurality of interconnects 122 of the first substrate 102, through the plurality of pillar interconnects 150. There may be solder interconnects (not shown) between the plurality of pillar interconnects 150 and the first plurality of interconnects 122. That is, in some implementations, solder interconnects may be used to couple the plurality of pillar interconnects 150 to the first plurality of interconnects 122. The underfill 152 is located between the first integrated device 105 and the first substrate 102. The first substrate 102 includes a solder resist layer 124 and a solder resist layer 126. The solder resist layer 124 is coupled to the first surface (e.g., top surface) of the first substrate 102. The solder resist layer 126 is coupled to a second surface (e.g., bottom surface) of the first substrate 102. A plurality of passive devices 130 is coupled to the second surface of the first substrate 102. The passive devices 130 may include a capacitor and/or an inductor.

The package 100 includes a second substrate 104 and a second integrated device 107. The second substrate 104 and the second integrated device 107 may be considered part of a second package. The second integrated device 107 is coupled to a first surface (e.g., top surface) of the second substrate 104, through a plurality of solder interconnects 170. The second substrate 104 includes at least one second dielectric layer 140 and a second plurality of interconnects 142. As will be further described below, the second plurality of interconnects 142 may include a plurality of post interconnects. The second integrated device 107 is coupled to the second plurality of interconnects 142 of the second substrate 104, through the plurality of solder interconnects 170. The second substrate 104 includes a solder resist layer 144 and a solder resist layer 146. The solder resist layer 144 is coupled to the first surface (e.g., top surface) of the second substrate 104. The solder resist layer 146 is coupled to a second surface (e.g., bottom surface) of the second substrate 104. The solder resist layer 146 includes a cavity. The solder resist layer 146 may include variable thicknesses. The second substrate 104 may be an interposer. The second substrate 104 may include two metal layers or more. In some implementations, the second substrate 104 may be fabricated using a modified semi-additive process (mSAP). In some implementations, the first substrate 102 may be fabricated using an embedded trace substrate (ETS) process.

The second substrate 104 is coupled to the first substrate 102 through a plurality of ball interconnects 109 and a plurality of solder interconnects 190. The plurality of ball interconnects 109 and the plurality of solder interconnects 190 are coupled to (i) the first plurality of interconnects 122 of the first substrate 102, and (ii) the second plurality of interconnects 142 of the second substrate 104. The plurality of ball interconnects 109 may include copper balls. The plurality of ball interconnects 109 and/or the plurality of solder interconnects 190 may be a means for inter-substrate interconnection. The plurality of ball interconnects 109 and/or the plurality of solder interconnects 190 may be examples of a plurality of inter-substrate interconnects. The plurality of solder interconnects 190 help the plurality of ball interconnects 109 couple to interconnects from the first substrate 102 and interconnects from the second substrate 104 The plurality of solder interconnects 190 may at least partially encapsulate the plurality of ball interconnects 109.

The first integrated device 105 is located between the first substrate 102 and the second substrate 104. The cavity in the solder resist layer 146 is located over (e.g., above) the first integrated device 105. For example, the cavity may be located between the solder resist layer 146 and the first integrated device 105. A back side of the first integrated device 105 faces the cavity of the solder resist layer 144. The cavity may be located between the solder resist layer 146 and the back side of the first integrated device 105. The cavity of may be located in a region of the package that includes the first integrated device 105.

The package 100 includes an encapsulation layer 108. The encapsulation layer 108 is located between the first substrate 102 and the second substrate 104. The encapsulation layer 108 may encapsulate the first integrated device 105, the plurality of ball interconnects 109 and/or the plurality of solder interconnects 190. The encapsulation layer 108 may be located in the cavity of the solder resist layer 144. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process.

As will be further described below, the use of a cavity (e.g., 250) in the solder resist layer 146, the post interconnects (from the plurality of interconnects 142), the plurality of ball interconnects 109 and/or the plurality of solder interconnects 190 allow for more interconnection between substrates, which helps improve the performance of the package. For example, the use of a cavity (e.g., 250) in the solder resist layer 146, the post interconnects (from the plurality of interconnects 142), the plurality of ball interconnects 109 and/or the plurality of solder interconnects 190 allow for interconnections between substrates that have smaller pitches (e.g., smaller center to center distances between neighboring interconnection), which allows more interconnections between substrates (thereby increasing density of interconnects). The use of a cavity in the solder resist layer 146, the post interconnects (from the plurality of interconnects 142), the plurality of ball interconnects 109 and/or the plurality of solder interconnects 190 allow for thinner packages with smaller gaps between substrate so that the packages may have inter-substrate interconnects between substrates that have low pitches. This in turns helps provide high routing density interconnects between substrates, For example, interconnects between the first substrate 102 and the second substrate 104 may have pitches that are less than 270 micrometers. For example, interconnects between the first substrate 102 and the second substrate 104 may have pitches that are between 150 and 270 micrometers. In some implementations, the number of inter-substrate interconnects (e.g., pin count) between the first substrate 102 and the second substrate 104 may be equal or greater than 300. In some implementations, the number of inter-substrate interconnects (e.g., pin count) between the first substrate 102 and the second substrate 104 may be as high as 400. In some implementations, the number of inter-substrate interconnects (e.g., pin count) between the first substrate 102 and the second substrate 104 may be between 300 and 400. Reducing the spacing between neighboring interconnects (e.g., neighboring ball interconnects, neighboring solder interconnects) and increasing the count of inter-substrate interconnects helps provide high density interconnect routing in packages. The high density interconnect routing between substrates help improve the performance of the package. In some implementations, reducing the spacing between neighboring interconnects may reduce the space that the interconnects take up by as much as 30 percent. In addition to increased routing density, the overall thickness of the package may be reduced by providing a solder resist layer with a cavity, where the cavity in the solder resist layer is located over an integrated device. That is, the cavity may be located between the solder resist layer and a hack side of an integrated device.

Figure 2:
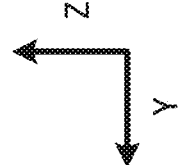
FIG. 2 illustrates a close up cross sectional profile view of a package that includes a substrate comprising post interconnects and a solder resist layer with a cavity.

FIG. 2 illustrates a close up view of the package 100. The package 100 includes the solder resist layer 146 that includes a cavity 250. The cavity 250 is filled with the encapsulation layer 108. The solder resist layer 146 includes two portions that have different thicknesses. The solder resist layer 146 includes the solder resist layer 146*a* (e.g., first portion of solder resist layer 146) and the solder resist layer 146*b* (e.g., second portion of the solder resist layer 146). The solder resist layer 146*a* has a thickness 240 and the solder resist layer 146*b* has a thickness 242. The solder resist layer 146*a* is thicker than the solder resist layer 146*b* The thickness 240 is greater than the thickness 242. There is a gap 282 between the solder resist layer 146*b* and a back side portion of the first integrated device 105. The gap 282 includes the cavity 250 of the solder resist layer 146. The gap 282 is filled with the encapsulation layer 108. There is a gap 280 between the solder resist layer 146*a* and the solder resist layer 124. The gap 280 is filled with the encapsulation layer 108. In some implementations, the thickness of the gap 282 may be less than the thickness of the gap 280. Thus, for example, a vertical gap between the solder resist layer 146*b* and the back side of the integrated device 105 may be less than a vertical gap between the solder resist layer 146*a* of the second substrate 104 and the solder resist layer 124 of the first substrate 102. In some implementations, a portion of the back side of the integrated device 105 may be located in the cavity 250. Thus, the cavity 250 helps accommodate the integrated device 105 between the first substrate 102 and the second substrate 104 while reducing the space or gap between the first substrate 102 and the second substrate 104.

The first plurality of interconnects 142 includes a plurality of post interconnects 142*a*. The plurality of post interconnects 142*a* is coupled to the plurality of ball interconnects 109 and the plurality of solder interconnects 190. The plurality of post interconnects 142*a* has a thickness that is less than the thickness of the solder resist layer 146*a*. The plurality of post interconnects 142*a* may be laterally surrounded by the solder resist layer 146*a*. The first plurality of interconnects 122 includes a plurality of interconnects 122.a (e.g., pad interconnects). The plurality of interconnects 122*a* is coupled to the plurality of ball interconnects 109 and the plurality of solder interconnects 190.

In some implementations, the plurality of ball interconnects 109 may have a pitch of about 200-270 micrometers. In some implementations, the plurality of ball interconnects 109 may include as much as 400 ball interconnects that laterally surround the first integrated device 105. Each of the ball interconnects 109 may represent a separate electrical path between the first substrate 102 and the second substrate

104. This configuration allows for smaller and thinner packages with higher density routing between the first substrate 102 and the second substrate 104, white avoiding any shorts between neighboring interconnects (e.g., neighboring ball interconnects 109, neighboring solder interconnects 190). The cavity 250 in the solder resist layer 146 helps ensure that the solder resist layer is not directly touching the first integrated device 105, as the first substrate 102 and the second substrate 104 are coupled together as close as possible.

In some implementations, to maximize and/or optimize the number of inter-substrate interconnects between the first substrate 102 and the second substrate 104, the pitch between inter-substrate interconnects may need to be reduced to be equal or less than 270 micrometers (e.g., 200-270 micrometers). To achieve this, the vertical gap and/or the vertical space between interconnects (e.g., 122*a*) from the first substrate 102 and interconnects (e.g., 142*a*) from the second substrate 104 may be reduced so that a plurality of ball interconnects 109 and/or a plurality of solder interconnects 190 with smaller sizes and/or smaller pitches may be used. This may be achieved my providing the post interconnects (from the plurality of interconnects 142), which helps narrow the vertical gaps between interconnects from the first substrate 102 and interconnects from the second substrate 104, thus allowing smaller sized and/or smaller pitch ball interconnects 109 and/or solder interconnects 190. As the vertical gap between the first substrate 102 and the second substrate 104 is reduced, the first integrated device 105 may hit the second substrate 104. To accommodate the first integrated device 105 between the first substrate 102 and the second substrate 104 while still reducing the vertical gap between the first substrate 102 and the second substrate 104, a cavity 250 is formed in the solder resist layer 146 so that the back side of the first integrated device 105 is not in direct contact with the second substrate 104. In some implementations, the use of post interconnects in the second substrate 104 helps provide smaller pitches for solder interconnects between substrates due to the post interconnects of the second substrate 104 and interconnects of the first substrate 102 being closer to each other, Smaller pitches between solder interconnects means that more solder interconnects may be provided for the same area, which means more high-density routing between substrates. As will be further described below in at least FIGS. 3 and 4, in some implementations, the use of post interconnects in both the first substrate 102 and the second substrate 104 can help provide even smaller pitches for solder interconnects between substrates due to the post interconnects of each substrate being closer to each other. This means more high-density routing between substrates may be provided.

Figure 3:
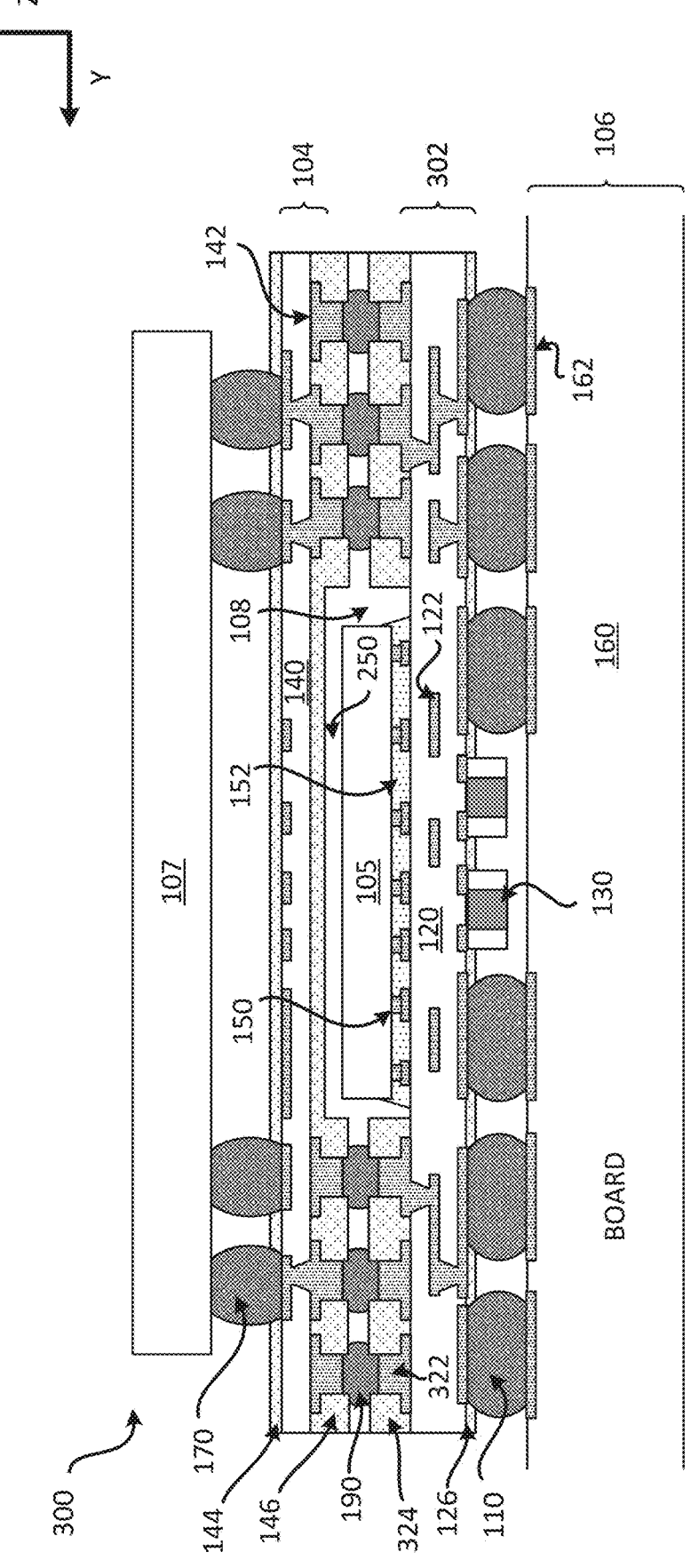
FIG. 3 illustrates an exemplary cross sectional profile view of a package that includes a substrate comprising post interconnects and a solder resist layer with a cavity.

The various components of the package 100 may have various thicknesses and/or dimensions, In some implementations, the plurality of post interconnects 142*a* may have a thickness of about 40-50 micrometers. In some implementations, the solder resist layer 146*a* may have a thickness (e.g., 240) of about 65-80 micrometers. In some implementations, the gap (e.g., 280) between the solder resist layer 124 and the solder resist layer 146*a* may be about 75-95 micrometers. In some implementations, the plurality of ball interconnects 109 may have a diameter of about 100-120 micrometers. In some implementations, the plurality of ball interconnects 109 may be optional. Thus, some package may bypass the use of the plurality of ball interconnects 109, FIG. 3 illustrates a cross sectional profile view of a package 300 that includes a substrate with post interconnects and a solder resist layer with a cavity The package 300 may be a package on package (PoP). The package 300 may be similar to the package 100 as described in FIGS. 1 and 2. The package 300 bypasses the use of ball interconnects while still providing thin packages with high density routing (e.g., high density inter-substrate interconnects) between substrates. The package 300 is coupled to the board 106 through the plurality of solder interconnects 110.

The package 300 includes a first substrate 302, a first integrated device 105 and an underfill 152. The first substrate 302, the first integrated device 105 and the underfill 152 may be considered part of a first package. The first integrated device 105 is coupled to a first surface (e.g., top surface) of the substrate 302, through a plurality of pillar interconnects 150. The first substrate 302 includes at least one first dielectric layer 120 and a first plurality of interconnects 122. The first plurality of interconnects 122 includes a plurality of post interconnects 322. The first integrated device 105 is coupled to the first plurality of interconnects 122 of the first substrate 302, through the plurality of pillar interconnects 150. There may be solder interconnects (not shown) between the plurality of pillar interconnects 150 and the first plurality of interconnects 122. A plurality of solder interconnects may be used to couple the plurality of pillar interconnects 150 to the first plurality of interconnects 122. The underfill 152 is located between the first integrated device 105 and the first substrate 302. The first substrate 302 includes a solder resist layer 324 and a solder resist layer 126. The solder resist layer 324 is coupled to the first surface (e.g., top surface) of the first substrate 302. The solder resist layer 324 has a thickness that is greater (e.g., thicker) than the thickness of the plurality of post interconnects 322. The plurality of post interconnects 322 may be laterally surrounded by, the solder resist layer 324. The solder resist layer 126 is coupled to a second surface (e.g., bottom surface) of the first substrate 302. A plurality of passive devices 130 is coupled to the second surface of the first substrate 302. The passive devices 130 may include a capacitor and/or an inductor.

The package 300 includes the second substrate 104 and the second integrated device 107. The second substrate 104 and the second integrated device 107 may be considered part of a second package. The second integrated device 107 is coupled to a first surface (e.g., top surface) of the second substrate 104, through a plurality of solder interconnects 170. The second substrate 104 includes at least one second dielectric layer 140 and a second plurality of interconnects 142, As will be further described below, the second plurality of interconnects 142 may include a plurality of post interconnects. The second integrated device 107 is coupled to the second plurality of interconnects 142 of the second substrate 104, through the plurality of solder interconnects 170. The second substrate 104 includes a solder resist layer 144 and a solder resist layer 146. The solder resist layer 144 is coupled to the first surface (e.g., top surface) of the second substrate 104. The solder resist layer 146 is coupled to a second surface (e.g., bottom surface) of the second substrate 104. The solder resist layer 146 includes a cavity. The solder resist layer 146 may include variable thicknesses. The second substrate 104 may be an interposer. The first substrate 302 may include the solder resist layer 324 that has a thickness (e.g., 460) that is greater (e.g., thicker) than the thickness of the plurality of post interconnects 322. The second substrate 104 may include two metal layers or more. In some implementations, the second substrate 104 may be fabricated using a modified semi-additive process (mSAP). In some implementations, the first substrate 302 may be fabricated using an embedded trace substrate (ETS) process.

The second substrate 104 is coupled to the first substrate 302 through the plurality of solder interconnects 190. The plurality of solder interconnects 190 is coupled to (i) the plurality of post interconnects 322 of the first substrate 302, and (ii) the second plurality of post interconnects 142a of the second substrate 104. The plurality of solder interconnects 190 may be a means for inter-substrate interconnection. The plurality of solder interconnects 190 may be examples of a plurality of inter-substrate interconnects.

The first integrated device 105 is located between the first substrate 302 and the second substrate 104. The cavity (e.g., 250) in the solder resist layer 146 is located over (e.g., above) the first integrated device 105. A back side of the first integrated device 105 faces the cavity of the solder resist layer 146. In some implementations, at least a portion of the back side of the first integrated device 105 may be located in the cavity 250 of the solder resist layer 146.

The package 300 includes an encapsulation layer 108. The encapsulation layer 108 is located between the first substrate 302 and the second substrate 104. The encapsulation layer 108 may encapsulate the first integrated device 105 and/or the plurality of solder interconnects 190. The encapsulation layer 108 may be located in the cavity of the solder resist layer 146.

As will be further described below, the use of a cavity in the solder resist layer 146, the post interconnects (from the plurality of interconnects 142), the plurality of solder interconnects 190 and the plurality of post interconnects 322 allow for thinner packages with interconnects between substrates that have low pitches. This in turns helps provide high routing density interconnects (e.g., high density inter-substrate interconnects) between substrates. For example, interconnects between the first substrate 302 and the second substrate 104 may have pitches that are less than 270 micrometers. For example, interconnects between the first substrate 302 and the second substrate 104 may have pitches that are between 150 and 270 micrometers. In some implementations, the number of inter-substrate interconnects (e.g., pin count) between the first substrate 302 and the second substrate 104 may be equal or greater than 300. In some implementations, the number of inter-substrate interconnects (e.g., pin count) between the first substrate 302 and the second substrate 104 may be as high as 400. In some implementations, the number of inter-substrate interconnects (e.g., pin count) between the first substrate 302 and the second substrate 104 may be between 300 and 400. Reducing the spacing between neighboring interconnects (e.g., neighboring solder interconnects) and increasing the count of inter-substrate interconnects helps provide high density interconnect routing in packages. The high density interconnect routing (e.g., high density inter-substrate interconnects) between substrates help improve the performance of the package. In some implementations, reducing the spacing between neighboring interconnects may reduce the space that the interconnects take up by as much as 30 percent. In addition to increased routing density, the overall thickness of the package may be reduced by providing a solder resist layer with a cavity, where the cavity in the solder resist layer is located over an integrated device.

Figure 4:
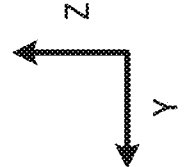
FIG. 4 illustrates a close up cross sectional profile view of a package that includes a substrate comprising post interconnects and a solder resist layer with a cavity.

FIG. 4 illustrates a close up view of the package 300. The package 300 includes the solder resist layer 146 that includes a cavity 250. The cavity 250 is filled with the encapsulation layer 108. The solder resist layer 146 includes two portions that have different thicknesses. The solder resist layer 146 includes the solder resist layer 146a and the solder resist layer 146b. The solder resist layer 146a has a thickness 240 and the solder resist layer 146b has a thickness

242. The solder resist layer 146a is thicker than the solder resist layer 14611 The thickness 240 is greater than the thickness 242. There is a gap 282 between the solder resist layer 146b and a back side portion of the first integrated device 105. The gap 282 includes the cavity 250 of the solder resist layer 146. The gap 282 is filled with the encapsulation layer 108. There is a gap 480 between the solder resist layer 146a and the solder resist layer 124. The gap 480 is filled with the encapsulation layer 108.

The first plurality of interconnects 142 includes a plurality of post interconnects 142a. The plurality of post interconnects 142a is coupled to the plurality of solder interconnects 190. The plurality of post interconnects 142a has a thickness that is less than the thickness of the solder resist layer 146a. The plurality of post interconnects 322 has a thickness that is less than the thickness of the solder resist layer 324. The plurality of post interconnects 322 is coupled to the plurality of solder interconnects 190.

In some implementations, to maximize and/or optimize the number of inter-substrate interconnects between the first substrate 102 and the second substrate 104, the pitch between inter-substrate interconnects may need to be reduced to be equal or less than 270 micrometers (e.g., 150-270 micrometers). To achieve this, the vertical gap and/or the vertical space between interconnects (e.g., 122a) from the first substrate 102 and interconnects (e.g., 142a) from the second substrate 104 may be reduced so that a plurality of solder interconnects 190 with smaller sizes and/or smaller pitches may be used. This may be achieved my providing the post interconnects (from the plurality of interconnects 142) and post interconnects 322 (from the plurality of interconnects 122), which helps narrow the vertical gaps between interconnects from the first substrate 102 and interconnects from the second substrate 104, thus allowing smaller sized and/or smaller pitch solder interconnects 190. As the vertical gap between the first substrate 102 and the second substrate 104 is reduced, the first integrated device 105 may hit the second substrate 104. To accommodate the first integrated device 105 between the first substrate 102 and the second substrate 104 while still reducing the vertical gap between the first substrate 102 and the second substrate 104, a cavity 250 is formed in the solder resist layer 146 so that the back side of the first integrated device 105 is not in direct contact with the second substrate 104. Below are exemplary dimensions and/or values for various components, that help provide inter-substrate interconnections that have pitches equal or less than 270 micrometers (e.g., 150-270 micrometers). In some implementations, the use of post interconnects in both the first substrate 102 and the second substrate 104 helps provide smaller pitches for solder interconnects between substrates due to the post interconnects of each substrate being closer to each other. Smaller pitches between solder interconnects means that more solder interconnects may be provided for the same area, which means more high-density routing between substrates.

The various components of the package 300 may have various thicknesses and/or dimensions. In some implementations, the plurality of post interconnects 142a may have a thickness of about 40-50 micrometers. In some implementations, the solder resist layer 146a may have a thickness (e.g., 240) of about 65-80 micrometers. In some implementations, the gap (e.g., 480) between the solder resist layer 124 and the solder resist layer 146a may be about 50-70 micrometers. In some implementations, the solder resist layer 324 may have a thickness (e.g., 460) of about 30-50 micrometers. In some implementations, the plurality of solder interconnects 190 may have a diameter of about 50-70 micrometers. In some implementations, the thickness of the gap 282 may be less than the thickness of the gap 480. Thus, for example, a vertical gap between the solder resist layer 146b and the back side of the integrated device 105 may be less than a vertical gap between the solder resist layer 146a of the second substrate 104 and the solder resist layer 324 of the first substrate 102. In some implementations, a portion of the back side of the integrated device 105 may be located in the cavity 250. Thus, the cavity 250 helps accommodate the integrated device 105 between the first substrate 102 and the second substrate 104 while reducing the space or gap between the first substrate 102 and the second substrate 104.

In some implementations, the dimensions mentioned above, help provide a package that includes the plurality of solder interconnects 190 that may have a pitch of about 150-270 micrometers. In some implementations, the plurality of solder interconnects 190 may include as much as 400 solder interconnects (e.g., solder balls) that laterally surround the first integrated device 105. Each of the solder interconnects 190 may represent a separate electrical path between the first substrate 302 and the second substrate 104. This configuration allows for smaller and thinner packages with higher density routing between the first substrate 302 arid the second substrate 104, while avoiding any shorts between neighboring interconnects (e.g., neighboring solder interconnects 190). The cavity 250 in the solder resist layer 146 helps ensure that the solder resist layer is not directly touching the first integrated device 105, as the first substrate 302 and the second substrate 104 are coupled together as close as possible.

A post interconnect as used in the disclose may be an interconnect whose height (e.g., thickness) is equal and/or greater than its width and/or diameter. A post interconnect may be coupled to a pad interconnect, A post interconnect may extend vertically from a pad interconnect (e.g., extend vertically from a surface of the pad interconnect). A post interconnect may be laterally surrounded (e.g., partial or complete) by a solder resist layer. A post interconnect may extend vertically and/or perpendicularly from a surface (e.g., first surface, second surface) of a substrate. A post interconnect of a substrate may extend vertically and/or perpendicularly from a surface of the substrate and away from a dielectric layer of the substrate of which the post interconnect is a part of. A post interconnect may not be in direct contact with a dielectric layer of a substrate. A post interconnect (e.g., 142a, 322) may be in direct contact with a solder resist layer (e.g., 146a, 324) of a substrate.

An integrated device (e.g., 105, 107) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a hulk acoustic wave (BAW) filter, a light emitting diode (LED) integrated device, a silicon (Si) based integrated device, a silicon carbide (SiC) based integrated device, a memory, lower management processor, and/or combinations thereof. An integrated device (e.g., 105, 107) may include at least one electronic circuit (e.g., first electronic circuit, second electronic circuit, etc . . . ). An integrated device may include transistors. An integrated device may be an example of an electrical component and/or electrical device. In some implementations, an integrated device may be a chiplet. The fabrication of chiplets may provide better and/or improved yields (relative to other types of integrated devices), which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that performs several functions may reduce the overall cost of a package relative to using a single chip to perform all of the functions of a package.

The package (e.g., 100, 300) may be implemented in a radio frequency (RE) package. The RE package may be a radio frequency front end (RFFE) package. A package (e.g., 100, 300) may be configured to provide Wireless Fidelity (WiFi) communication and/or cellular communication (e.g., 2G, 3G, 4G, 5G). The packages (e.g., 100, 300) may be configured to support Global System for Mobile (GSM) Communications, Universal Mobile Telecommunications System (UMTS), and/or Long-Term Evolution (LTE). The packages (e.g., 100, 300) may be configured to transmit and receive signals having different frequencies and/or communication protocols.

Having described various packages, a sequence for fabricating a package will now be described below.

Figure 5A:
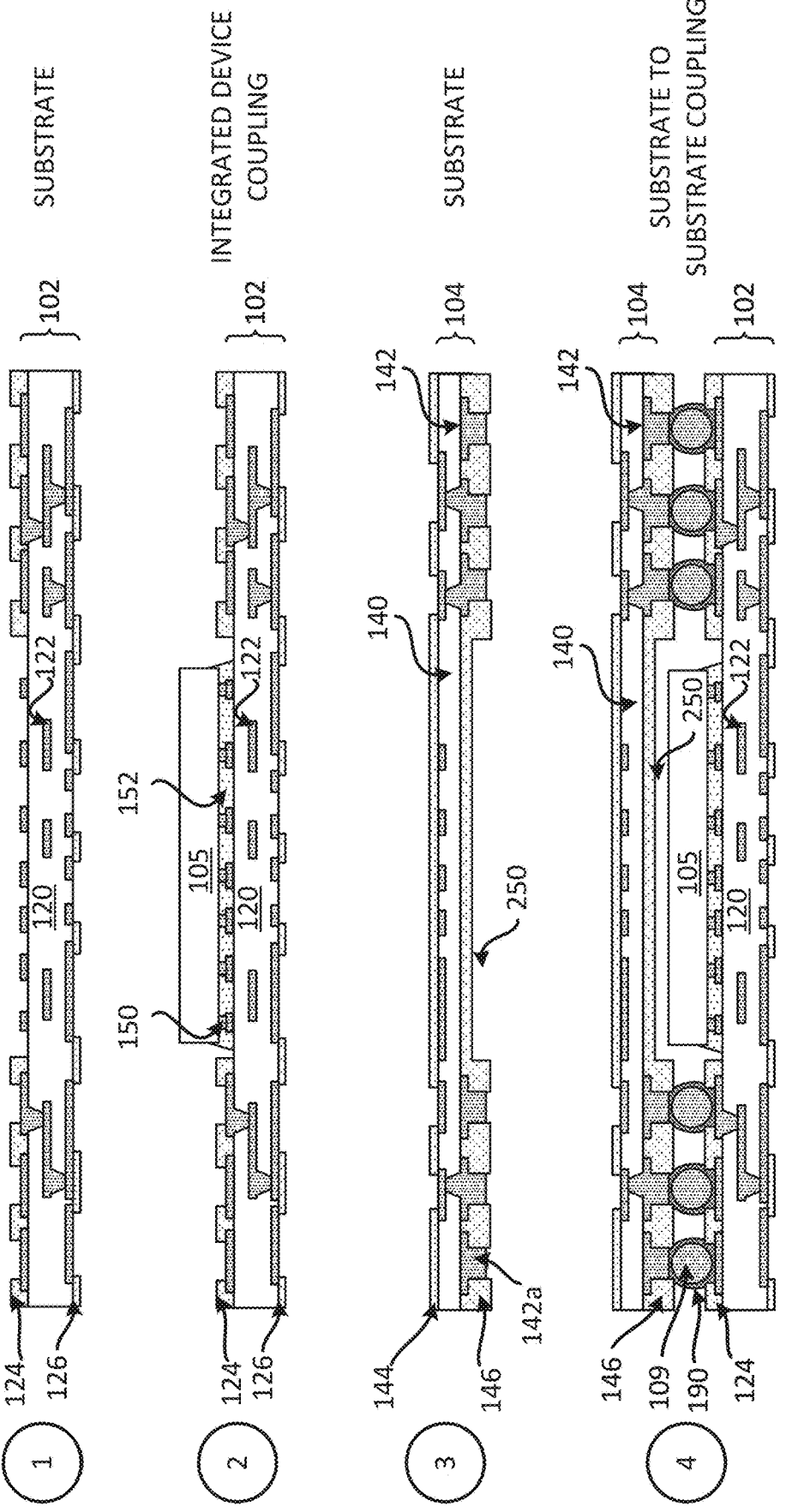
FIGS. 5A-5C illustrate an exemplary sequence for fabricating a package that includes a substrate comprising post interconnects and a solder resist layer with a cavity.
Figure 5B:
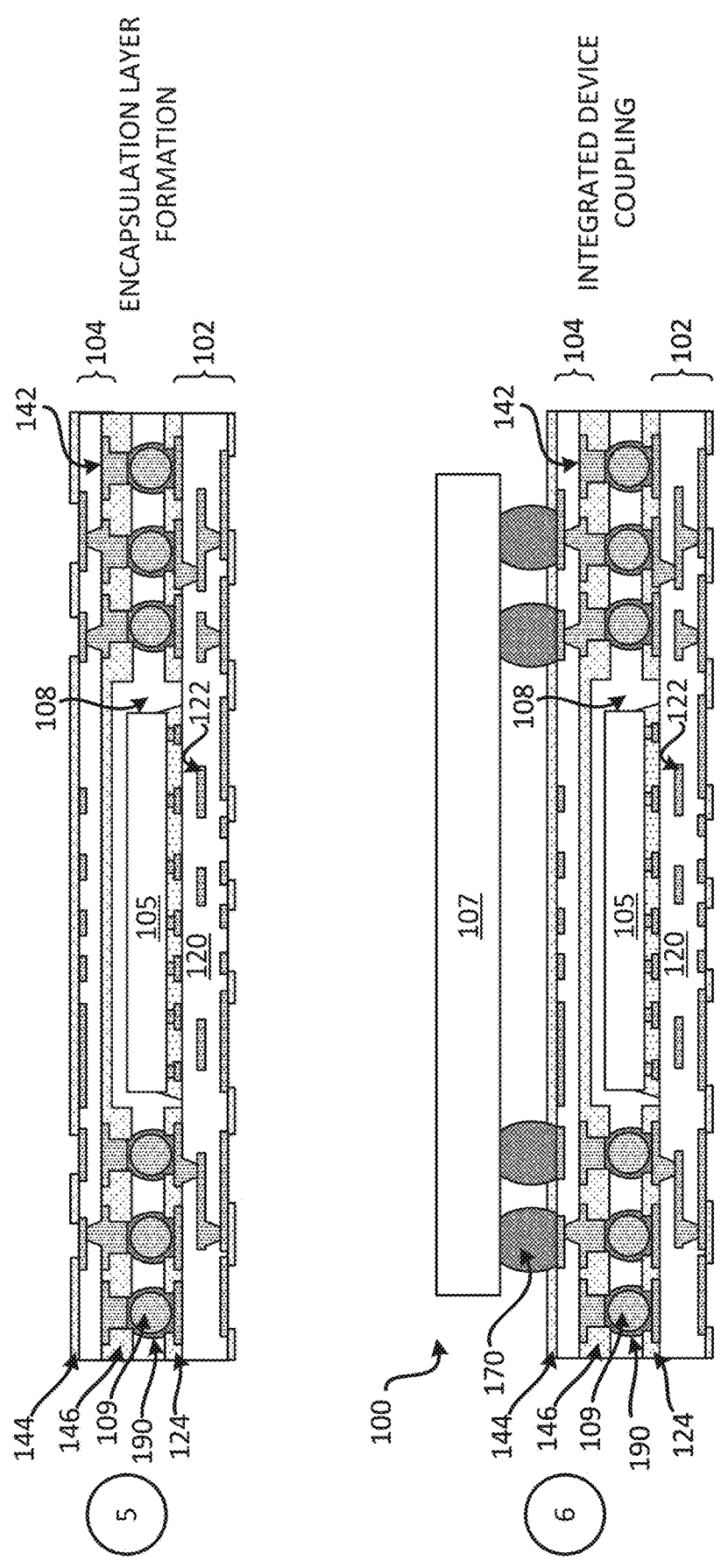
Figure 5C:
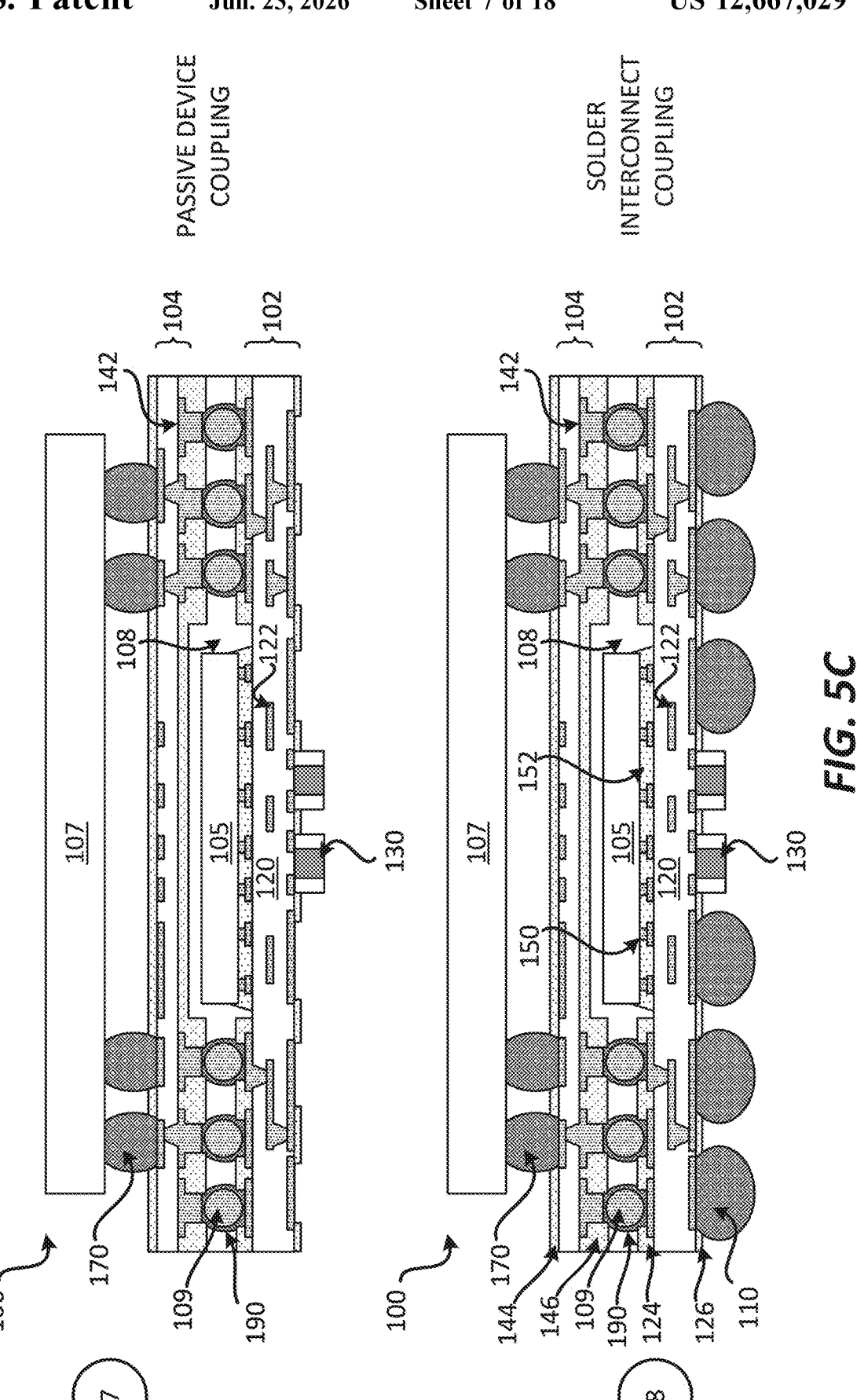

Exemplary Sequence for Fabricating a Package Comprising a Substrate with Post Interconnects and a Solder Resist Layer with a Cavity In some implementations, fabricating a package includes several processes. FIGS. 5A-5C illustrate an exemplary sequence for providing or fabricating a package. In some implementations, the sequence of FIGS. 5A-5C may be used to provide or fabricate the package 100. However, the process of FIGS. 5A-5C may be used to fabricate any of the packages (e.g., 300) described in the disclosure.

It should be noted that the sequence of FIGS. 5A-5C may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 5A, illustrates a state after a substrate 102 is provided. The substrate 102 includes at least one dielectric layer 120 and a plurality of interconnects 122. The substrate 102 may include a first surface (e.g., top surface) and a second surface (e.g., bottom surface). The substrate 102 may be fabricated using the method as described in FIGS. 10A-10C In some implementations, a cored substrate is provided (e.g., substrate that includes a core layer).

Stage 2 illustrates a state after a first integrated device 105 is coupled to the first surface (e.g., top surface) of the substrate 102. The first integrated device 105 may be coupled to the substrate 102 through the plurality of pillar interconnects 150 and solder interconnects (not shown). A solder reflow process may be used to couple the first integrated device 105 to the substrate 102. Stage 2 also illustrates an underfill 152 that is provided and/or formed between the first integrated device 105 and the substrate 102.

Stage 3 illustrates a state after a substrate 104 is provided. The substrate 104 includes at least one dielectric layer 140 and a plurality of interconnects 142. The substrate 104 may include a first surface (e.g., top surface) and a second surface (e.g., bottom surface). The plurality of interconnects 142 may include post interconnects142a. The substrate 104 includes a solder resist layer 144 and a solder resist layer 146. The solder resist layer 146 includes a cavity (e.g., 250). The substrate 104 may be fabricated using the method as described in FIGS. 10A-10C. In some implementations, a cored substrate is provided (e.g., substrate that includes a core layer).

Stage 4 illustrates a state after the substrate 104 is coupled to the substrate 102 through a plurality of ball interconnects 109 and the plurality of solder interconnects 190. A solder reflow process may be used to couple the substrate 104 to the substrate 102. The plurality of ball interconnects 109 may be coupled to the substrate 104 before the substrate 104 is coupled to the substrate 102. The substrate 104 is coupled to the substrate 102 such that the first integrated device 105 is located between the substrate 102 and the substrate 104. The first integrated device 105 may be located underneath the cavity (e.g., 250) of the solder resist layer 146. The plurality of ball interconnects 109 and the plurality of solder interconnects 190 are coupled to (i) the plurality of post interconnects 142a of the second substrate 104, and (ii) the plurality of interconnects 122 of the first substrate 102.

Stage 5, as shown in FIG. 5B, illustrates a state after an encapsulation layer 108 is provided between the substrate 102 and the substrate 104. The encapsulation layer 108 may encapsulate the first integrated device 105, the plurality of bail. interconnects 109 and/or the plurality of solder interconnects 190. The encapsulation layer 108 may be located in the cavity (e.g., 250) of the solder resist layer 146. The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process.

Stage 6 illustrates a state after a second integrated device 107 is coupled to the first surface (e.g., top surface) of the substrate 104. The second integrated device 107 may be coupled to the substrate 104 through the plurality of solder interconnects 170. A solder reflow process may be used to couple the second integrated device 107 to the substrate 104.

Stage 7, as shown in FIG. 5C, illustrates a plurality of passive devices 130 is coupled to the second surface (e.g., bottom surface) of the substrate 102. The plurality of passive devices 130 may be coupled to the substrate 102 through the plurality of solder interconnects (not shown). A solder reflow process may be used to couple the plurality of passive devices 130 to the substrate 102.

Stage 8 illustrates a state after a plurality of solder interconnects 110 is coupled to the second surface of the substrate 102. A solder reflow process may be used to couple the plurality of solder interconnects 110 to the substrate 102. Stage 8 may illustrate the package 100. The package 100 may be fabricated one at a time or may be fabricated together as part of one or more wafers and then singulated into individual packages.

Figure 6A:
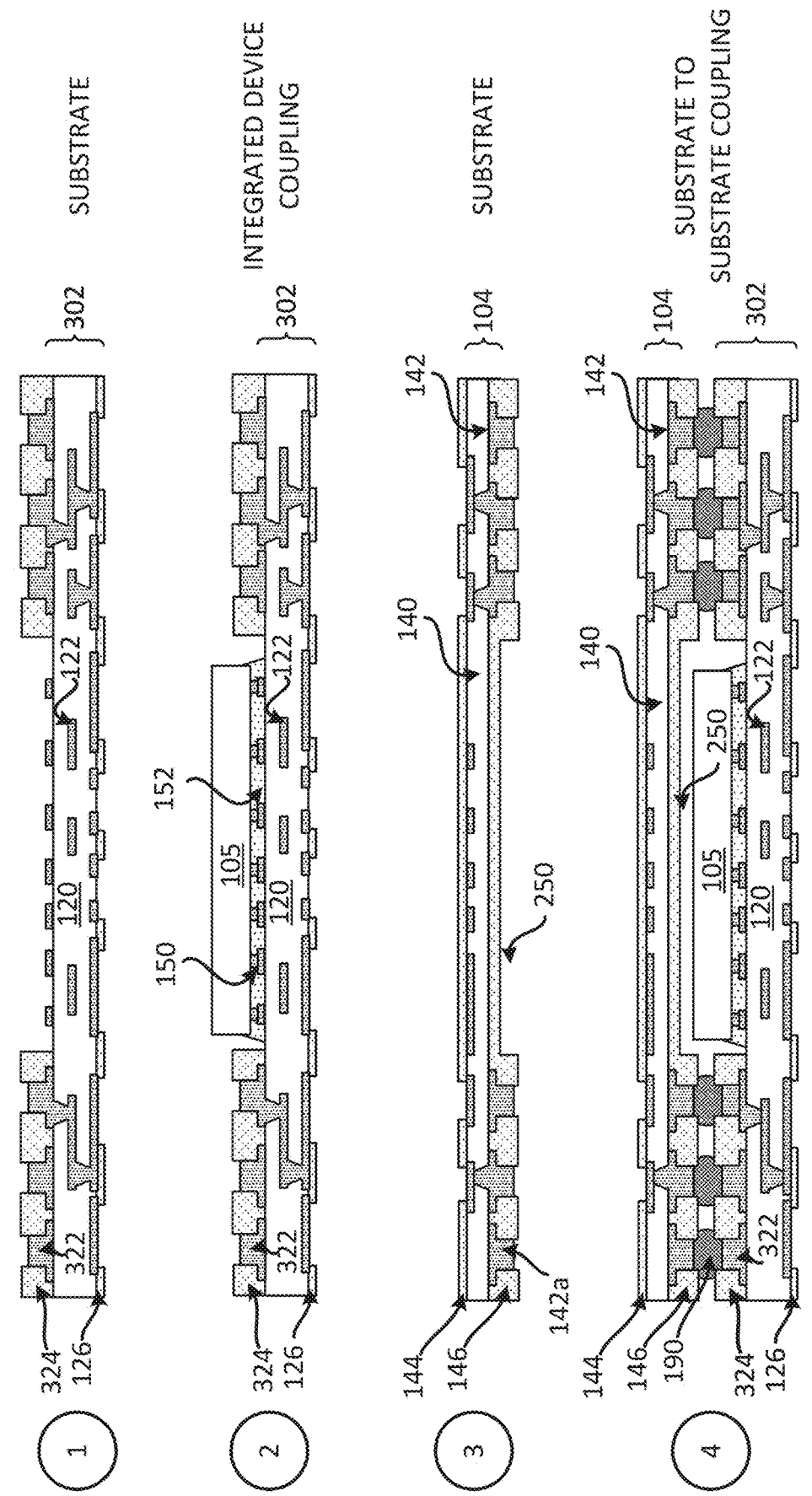
FIGS. 6A-6C illustrate an exemplary sequence for fabricating a package that includes a substrate comprising post interconnects and a solder resist layer with a cavity.
Figure 6B:
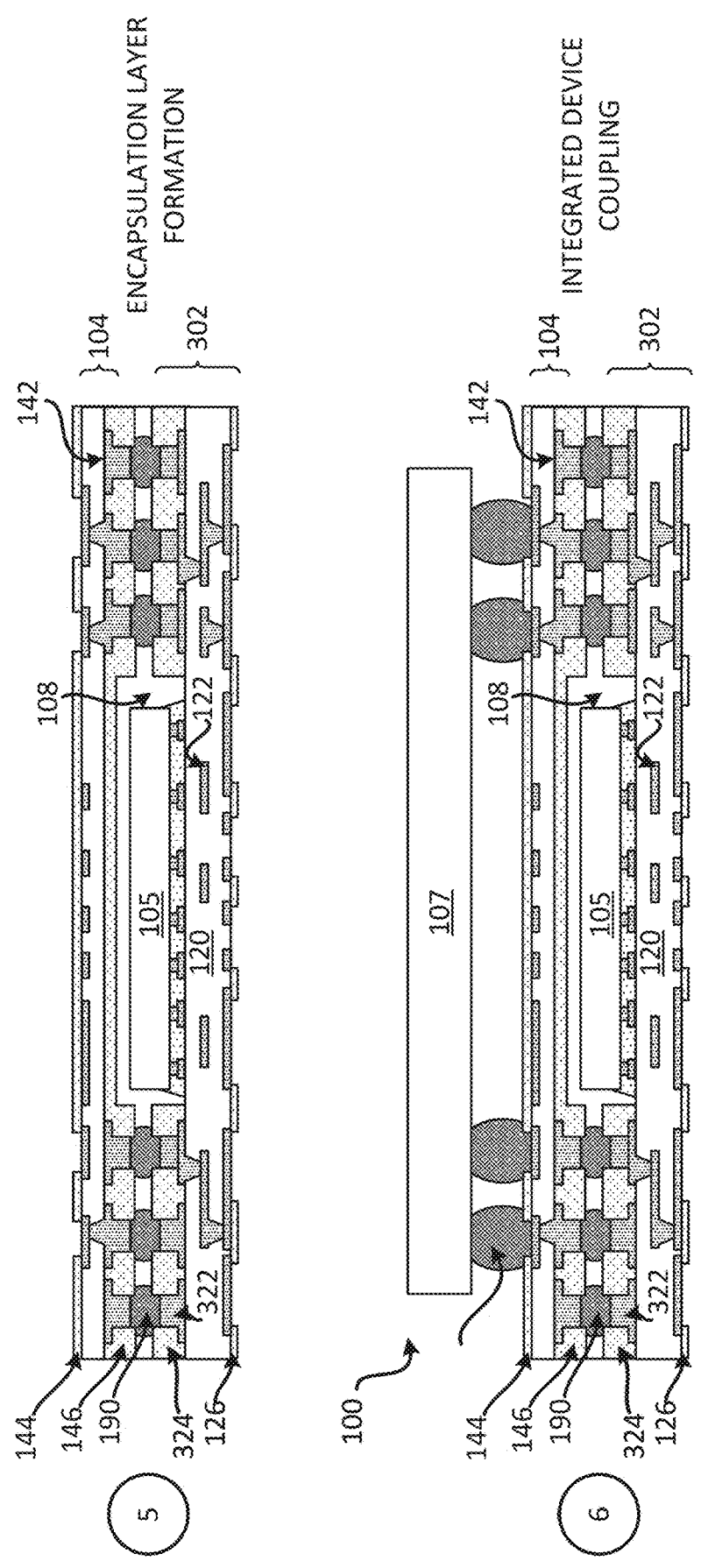
Figure 6C:
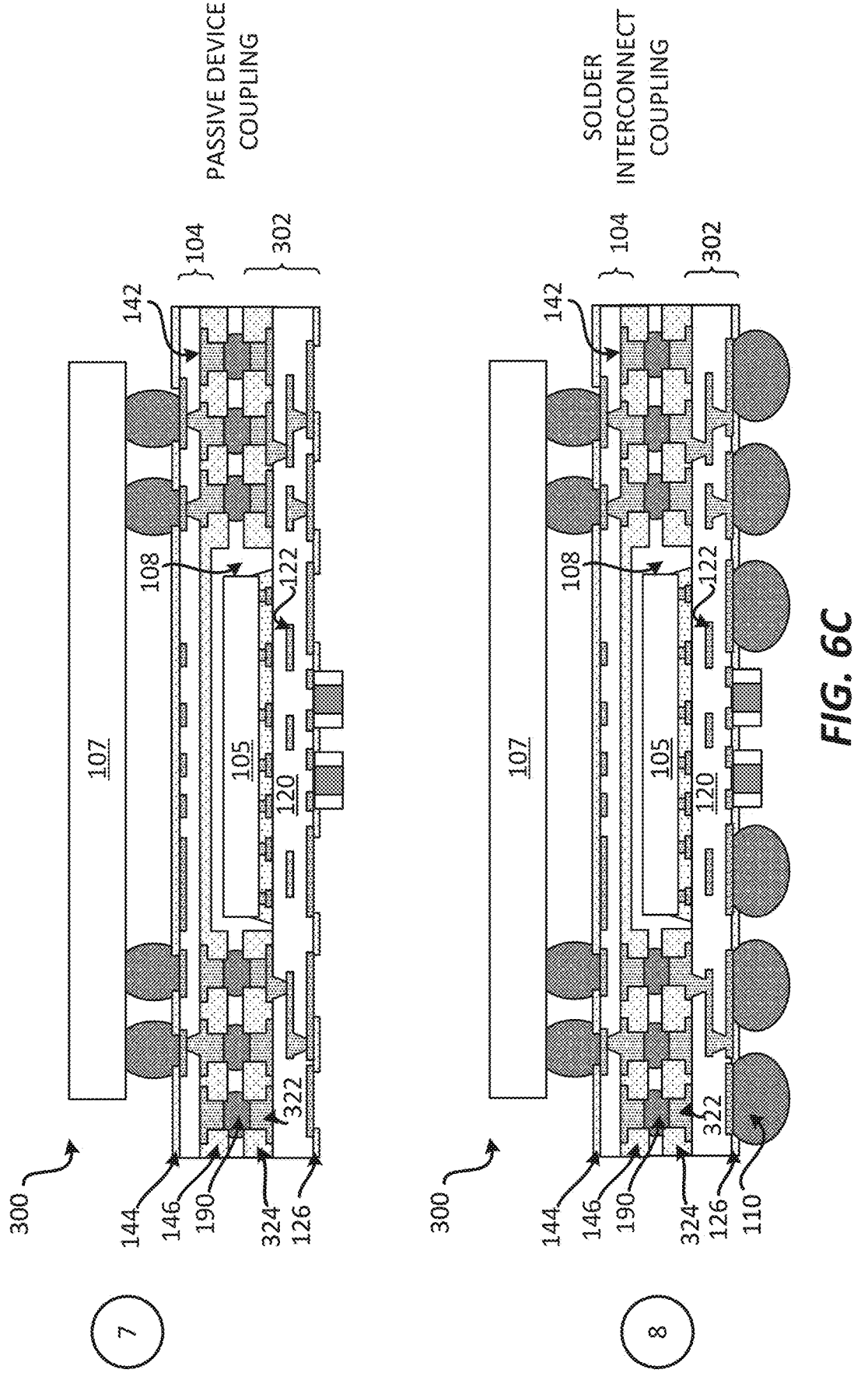

Exemplary Sequence for Fabricating a Package Comprising a Substrate with Post Interconnects and a Solder Resist Layer with a Cavity In some implementations, fabricating a package includes several processes. FIGS. 6A-6C illustrate an exemplary sequence for providing or fabricating a package. In some implementations, the sequence of FIGS. 6A-6C may be used to provide or fabricate the package 300. However, the process of FIGS. 6A-6C may be used to fabricate any of the packages (e.g., 100) described in the disclosure.

It should be noted that the sequence of FIGS. 6A-6C may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 6A, illustrates a state after a substrate 302 is provided. The substrate 302 includes at least one dielectric layer 120 and a plurality of interconnects 122. The plurality of interconnects 122 includes a plurality of post interconnects 322. The substrate 302 includes a solder resist layer 324 and a plurality of solder resist layer 126. The substrate 302 may include a. first surface (e.g., top surface) and a second surface (e.g., bottom surface). The substrate 302 may be fabricated using the method as described in FIGS. 10A-10C. In some implementations, a cored substrate is provided (e.g., substrate that includes a core layer).

Stage 2 illustrates a. state after a first integrated device 105 is coupled to the first surface (e.g., top surface) of the substrate 302. The first integrated device 105 may be coupled to the substrate 302 through the plurality of pillar interconnects 150 and solder interconnects (not shown). A solder reflow process may be used to couple the first integrated device 105 to the substrate 302. Stage 2 also illustrates an underfill 152 that is provided and/or formed between the first integrated device 105 and the substrate 102.

Stage 3 illustrates a state after a substrate 104 is provided. The substrate 104 includes at least one dielectric layer 140 and a plurality of interconnects 142. The substrate 104 may include a first surface (e.g., top surface) and a second surface (e.g., bottom surface). The plurality of interconnects 142 may include post interconnects142a. The substrate 104 includes a solder resist layer 144 and a solder resist layer 146. The solder resist layer 146 includes a cavity (e.g., 250). The substrate 104 may be fabricated using the method as described in FIGS. 10A-10C. In some implementations, a cored substrate is provided (e.g., substrate that includes a core layer).

Stage 4 illustrates a state after the substrate 104 is coupled to the substrate 302 through the plurality of solder interconnects 190. A solder reflow process may be used to couple the substrate 104 to the substrate 302. The substrate 104 is coupled to the substrate 302 such that the first integrated device 105 is located between the substrate 302 and the substrate 104. The first integrated device 105 may be located underneath the cavity (e.g., 250) of the solder resist layer 146. The plurality of solder interconnects 190 is coupled to (i) the plurality of post interconnects 142a of the second substrate 104, and (ii) the plurality of post interconnects 322 of the first substrate 302. The plurality of solder interconnects 190 may be first coupled to the substrate 104 through a solder reflow process, and then the substrate 104 is coupled to the substrate 302 through the plurality of solder interconnects 190 through a solder reflow process.

Stage 5, as shown in FIG. 6B, illustrates a state after an encapsulation layer 108 is provided between the substrate 302 and the substrate 104. The encapsulation layer 108 may encapsulate the first integrated device 105 and/or the plurality of solder interconnects 190. The encapsulation layer 108 may be located in the cavity (e.g., 250) of the solder resist layer 146. The encapsulation layer 108 may include a mold, a. resin and/or an epoxy. The encapsulation layer 108 may be a means for encapsulation. The encapsulation layer 108 may be provided by using a compression and transfer molding process, a sheet molding process, or a liquid molding process.

Stage 6 illustrates a state after a second integrated device 107 is coupled to the first surface (e.g., top surface) of the substrate 104. The second integrated device 107 may be coupled to the substrate 104 through the plurality of solder interconnects 170. A solder reflow process may be used to couple the second integrated device 107 to the substrate 104.

Stage 7, as shown in FIG. 6C, illustrates a plurality of passive devices 130 is coupled to the second surface (e.g., bottom surface) of the substrate 302. The plurality of passive devices 130 may be coupled to the substrate 302 through the plurality of solder interconnects (not shown). A solder reflow process may be used to couple the plurality of passive devices 130 to the substrate 302.

Stage 8 illustrates a state after a plurality of solder interconnects 110 is coupled to the second surface of the substrate 302, A solder reflow process may be used to couple the plurality of solder interconnects 110 to the substrate 302. Stage 8 may illustrate the package 300. The package 300 may be fabricated one at a time or may be fabricated together as part of one or more wafers and then singulated into individual packages.

Exemplary Flow Diagram of a Method for Fabricating a Package Comprising a Substrate with Post Interconnects and a Solder Resist Layer with a Cavity In some implementations, fabricating a package includes several processes. FIG. 7 illustrates an exemplary flow diagram of a method 700 for providing or fabricating a package, In some implementations, the method 700 of FIG. 7 may be used to provide or fabricate the package 100 described in the disclosure. However, the method 700 may be used to provide or fabricate any of the packages (e.g., 300) described in the disclosure.

It should be noted that the method 700 of FIG. 7 may combine one or more processes in order to simplify and/or clarify the method for providing or fabricating a package. In some implementations, the order of the processes may be changed or modified.

The method provides (at 705) a first substrate (e.g., 102) and a first integrated device (e.g., 105) coupled to a first surface of the first substrate (e.g., 102). The first substrate 102 and the first integrated device 105 may be part of a first package. The first substrate 102 includes at least one first dielectric layer 120 and a first plurality of interconnects 122. In some implementations, the first substrate may include a plurality of post interconnects (e.g., 322). The first substrate 102 may include a solder resist layer 124 and/or a solder resist layer 126. The substrate 102 may be fabricated using the method as described in FIGS. 101-10C. Stage 1 of FIG. 5A illustrates and describes an example of a first substrate that is provided. Stage 2 of FIG. 5A illustrates and describes an example of a first substrate with a first integrated device. Stage 1 of FIG. 6A illustrates and describes an example of a first substrate that is provided. Stage 2 of FIG. 6A illustrates and describes an example of a first substrate with a first integrated device.

The method provides (at 710) a second substrate (e.g., 104). The second substrate 104 includes at least one second dielectric layer 140 and a second plurality of interconnects 142. The second plurality of interconnects 142 may include post interconnects (e.g., 142*a*). The second substrate may include a solder resist layer with variable thickness. For example, the second substrate may include a solder resist layer with a first thickness and a. second thickness. The second substrate may include a solder resist layer with a cavity (e.g., 250). The substrate 104 may be fabricated using the method as described in FIGS. 10A-10C. In some implementations, the substrate 104 may be fabricated using mSAP. Stage 3 of FIG. 5A illustrates and describes an example of a second substrate that is provided. Stage 3 of FIG. 6A illustrates and describes an example of a second substrate that is provided.

The method couples (at 715) a second substrate (e.g, 104) to the first substrate (e.g., 102) through a plurality of ball interconnects (e.g., 109) and/or a plurality of solder interconnects (e.g., 190). The plurality of ball interconnects 109 and/or the plurality of solder interconnects 190 are example of inter-substrate interconnects. A solder reflow process may be used to couple the second substrate to the first substrate. Stage 4 of FIG. 5A illustrates and describes an example of a second substrate coupled to a first substrate. Stage 4 of FIG. 6A illustrates and describes an example of a second substrate coupled to a first substrate.

The method provides (at 720) an encapsulation layer (e.g., 108) between the first substrate (e.g., 102, 302) and the second substrate (e.g., 104). The encapsulation layer 108 may include a mold, a resin and/or an epoxy. The encapsulation layer 108 may be a means for encapsulation. The encapsulation layer 108 may be provided by using a compression and transfer molding process, a sheet molding process, or a liquid molding process. At least a portion of the encapsulation layer 108 may be located between the second substrate 104 and the first integrated device 105. Stage 5 of FIG. 5B illustrates and describes an example of providing an encapsulation layer. Stage 5 of FIG. 6B illustrates and describes an example of providing an encapsulation layer.

The method couples (at 725) a second integrated device (e.g., 107) to a first surface of the second substrate (e.g., 104) through a plurality of solder interconnects (e.g., 170). A solder reflow process may be used to couple the second integrated device to the first surface of the second substrate 104. Stage 6 of FIG. 5B illustrates and describes an example of a second integrated device coupled to a second substrate. Stage 6 of FIG. 613 illustrates and describes an example of a second integrated device coupled to a second substrate.

The method couples (at 730) passive devices (e.g., 130) and a plurality solder interconnects (e.g., 110) to a second surface of the first substrate (e.g., 102, 302). A solder reflow process may be used to couple the passive devices and/or the solder interconnects to the second surface of the first substrate (e.g., 102, 302). Stage 7 of FIG. 5C illustrates and describes an example of coupling passive devices to a substrate. Stage 7 of FIG. 6C illustrates and describes an example of coupling passive devices to a substrate. Stage 8 of FIG. 5C illustrates and describes an example of coupling solder interconnects to a substrate, Stage 8 of FIG. 6C illustrates and describes an example of coupling solder interconnects to a substrate.

In some implementations, several packages are fabricated at the same time. In such cases, the method may singulate the package (e.g., 100, 300).

Figure 8:
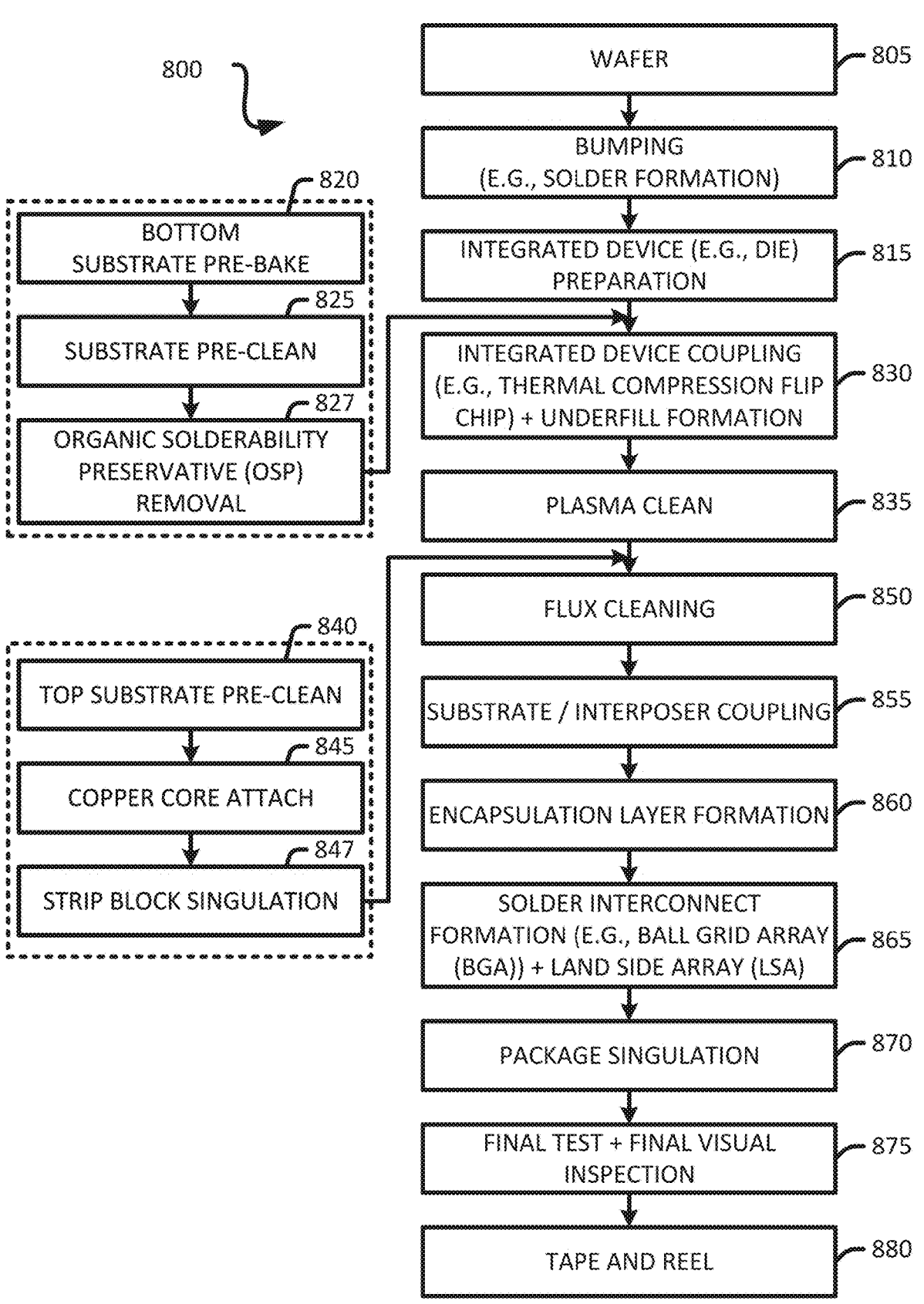
FIG. 8 illustrates an exemplary flow chart of a method for fabricating a. package that includes substrates coupled through ball interconnects.

Exemplary Flow Diagram of a Method for Fabricating a Package Comprising Substrates Coupled Through Ball interconnects FIG. 8 illustrates an exemplary flow diagram of a method 800 for providing or fabricating a package, In some implementations, the method 800 of FIG. 8 may be used to provide or fabricate some or all of the package of FIG. 1 described in the disclosure. However, the method 800 may be used to provide or fabricate any of the packages described in the disclosure.

It should be noted that the method 800 of FIG. 8 may combine one or more processes in order to simplify and/or clarify the method for providing or fabricating a package. In some implementations, the order of the processes may be changed or modified.

The method provides (at 805) a wafer. The wafer may serve as a substrate on which integrated devices may be formed and/or coupled to. In some implementations, other substrates may be coupled to the wafer. The wafer may include silicon. The wafer may serve as a base on which components are built over.

The method forms (at 810) solder interconnects on the wafer. A solder reflow process may be used to form (e.g., couple) solder interconnects on the wafer.

The method prepares (at 815) one or more integrated devices (e.g., dies) for coupling. Preparing the integrated devices may include fabricating the integrated devices.

The method provides and prepares (at 820) a first substrate (e.g., substrate 102. bottom substrate) by pre-baking the first substrate. The first substrate may be pre-baked to remove moisture on the first substrate to avoid outgassing during a subsequent thermal compression flip chip coupling process. The method pre-cleans (at 825) the first substrate. The method removes (at 827) organic solderability preservative (OSP) on the first substrate.

Once the first substrate is provided and prepared, the first substrate may be coupled to the wafer through the solder interconnects that are formed on the wafer.

The integrated device(s) is/are coupled (at 830) to the first substrate. For example, the integrated device 105 may be coupled to the substrate 102 through a thermal compression flip chip process. An underfill may be provided between the integrated device and the substrate. Stage 2 of FIG. 5A illustrates and describes an example of an integrated device that is coupled to a substrate and an underfill that is provided between the integrated device and the substrate.

The method performs (at 835) a plasma clean of the first substrate. The plasma clean may remove contamination on the surface of the substrate.

The method pre-cleans (at 840) a second substrate (e.g., substrate 104, top substrate). Stage 3 of FIG. 5A illustrates and describes an example of a second substrate that is provided. The method couples (at 845) ball interconnects (e.g., copper core ball) to the second substrate. The ball interconnects may be coupled to the second substrate 104 through solder interconnects (e.g., 190). A solder reflow process may be used to couple the ball interconnects to the second substrate. The method performs (at 847) strip block simulation of the second substrate. This may be done, when several substrates are fabricated at the same time and then subsequently singulated.

The method performs (at 850) a flux cleaning of one or more substrates. Flux cleaning may remove oxides from metal, of the substrate. The flux cleaning may be performed on the first substrate and/or the second substrate.

The method couples (at 855) the second substrate (e.g., 104) to the first substrate (e.g., 102) through the ball interconnects. A solder reflow process may be used to couple the second substrate to the first substrate. Stage 4 of FIG. 5A illustrates and describes an example of coupling a substrate to another substrate.

The method provides (at 860) an encapsulation layer (e.g., 108) between the first substrate and the second substrate. Stage 5 of FIG. SB illustrates and describes an example providing an encapsulation layer between substrates.

The method forms (at 865) solder interconnects or land side array (LSA) on the first substrate. A solder reflow process may be used to form the solder interconnects. The solder interconnects may be a ball grid array (BGA).

The method singulates (at 870) the packages into individual packages. This may occur when several packages are fabricated at the same time. Singulating the package may include singulating the wafer that includes the first substrates, the integrated device(s), and the second substrates. A mechanical process (e.g., saw) or a laser may be used to cingulate the packages.

The method performs (at 875) a final test and final visual inspection of the package. This may include testing whether the package works properly by attaching probes to the package to determine whether the package works as intended. Visual inspection may include visually inspecting to see whether the package has any defects.

The method performs (at 880) tape and reel of the packages. This may include packaging the singulated packages together with tape so that the package can be properly shipped.

It is noted that additional processes may be performed on the packages, including coupling other components, such as passive components and/or integrated devices to the packages. FIG. 8 illustrates an example of how packages may be fabricated, FIG. 8 is not intended to illustrate the only way that a package may be fabricated.

Figure 9:
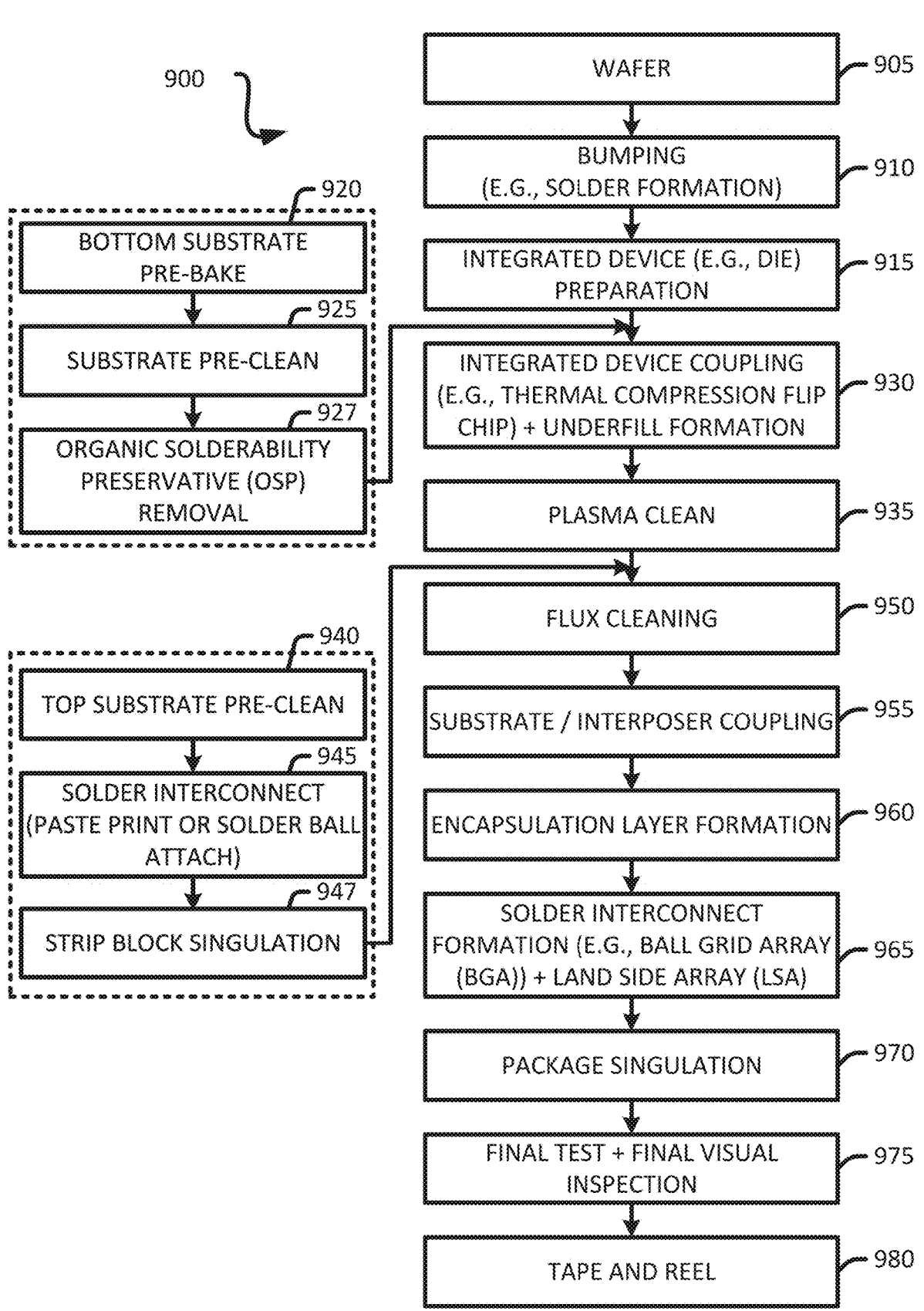
FIG. 9 illustrates an exemplary flow chart of a method for fabricating a package that includes substrates coupled through solder interconnects.

Exemplary Flow Diagram of a Method for Fabricating a Package Comprising Substrates Coupled Through Solder Interconnects FIG. 9 illustrates an exemplary flow diagram of a method 900 for providing or fabricating a package. In some implementations, the method 900 of FIG. 9 may be used to provide or fabricate some or all of the package of FIG. 3 described in the disclosure. However, the method 900 may be used to provide or fabricate any of the packages described in the disclosure.

It should be noted that the method 900 of FIG. 9 may combine one or more processes in order to simplify and/or clarify the method for providing or fabricating a package. In some implementations, the order of the processes may be changed or modified.

The method provides (at 905) a wafer. The wafer may serve as a substrate on which integrated devices may be formed and/or coupled to. In some implementations, other substrates may be coupled to the wafer. The wafer may include silicon. The wafer may serve as a base on which components are built over.

The method forms (at 910) solder interconnects on the wafer. A solder reflow process may be used to form (e.g., couple) solder interconnects on the wafer.

The method prepares (at 915) one or more integrated devices (e.g., dies) for coupling. Preparing the integrated devices may include fabricating the integrated devices.

The method provides and prepares (at 920) a first substrate (e.g., substrate 302, bottom substrate) by pre-baking the first substrate. The first substrate may be pre-baked to remove moisture on the first substrate to avoid outgassing during a subsequent thermal compression flip chip coupling process. The method pre-cleans (at 925) the first substrate. The method removes (at 927) organic solderability preservative (OSP) on the first substrate.

Once the first substrate is provided and prepared, the first substrate may be coupled to the wafer through the solder interconnects that are formed on the wafer.

The integrated device(s) is/are coupled (at 930) to the first substrate. For example, the integrated device 105 may be coupled to the substrate 102 through a thermal compression flip chip process. An underfill may be provided between the integrated device and the substrate. Stage 2 of FIG. 6A illustrates and describes an example of an integrated device that is coupled to a substrate and an underfill that is provided between the integrated device and the substrate.

The method performs (at 935) a plasma clean of the first substrate. The plasma clean may remove contamination on the surface of the substrate.

The method pre-cleans (at 940) a second substrate (e.g., substrate 104, top substrate). Stage 3 of FIG. 6A illustrates and describes an example of a second substrate that is provided. The method forms (at 945) solder interconnects on the second substrate. The solder interconnects (e.g., 190) may be coupled to the second substrate 104 through a paste printing process or through solder ball attach process. A solder reflow process may be used to couple the ball interconnects to the second substrate. The method performs (at 947) strip block singulation of the second substrate. This may be done, when several substrates are fabricated at the same time and then subsequently singulated.

The method performs (at 950) a flux cleaning of one or more substrates. Flux cleaning may remove oxides from metal of the substrate. The flux cleaning may be performed on the first substrate and or the second substrate.

The method couples (at 955) the second substrate (e.g., 104) to the first substrate (e.g., 102) through the ball interconnects. A solder reflow process may be used to couple the second substrate to the first substrate. Stage 4 of FIG. 6A illustrates and describes an example of coupling a substrate to another substrate.

The method provides (at 960) an encapsulation layer (e.g., 108) between the first substrate and the second substrate. Stage 5 of FIG. 6B illustrates and describes an example providing an encapsulation layer between substrates.

The method forms (at 965) solder interconnects or land side array (LSA) on the first substrate. A solder reflow process may be used to form the solder interconnects. The solder interconnects may be a ball grid array (BGA).

The method singulates (at 970) the packages into individual packages. This may occur when several packages are fabricated at the same time. Singulating the package may include singulating the wafer that includes the first substrates, the integrated device(s), and the second substrates. A mechanical process (e.g., saw) or a laser may be used to singulate the packages.

The method performs (at 975) a final test and final visual inspection of the package. This may include testing whether the package works properly by attaching probes to the package to determine whether the package works as intended. Visual inspection may include visually inspecting to see whether the package has any defects.

The method performs (at 980) tape and reel of the packages. This may include packaging the singulated packages together with tape so that the package can be properly shipped.

It is noted that additional processes may be performed on the packages, including coupling other components, such as passive components and/or integrated devices to the packages. FIG. 9 illustrates an example of how packages may be fabricated. FIG. 9 is not intended to illustrate the only way that a package may be fabricated.

Exemplary Sequence for Fabricating a Substrate

Figure 10A:
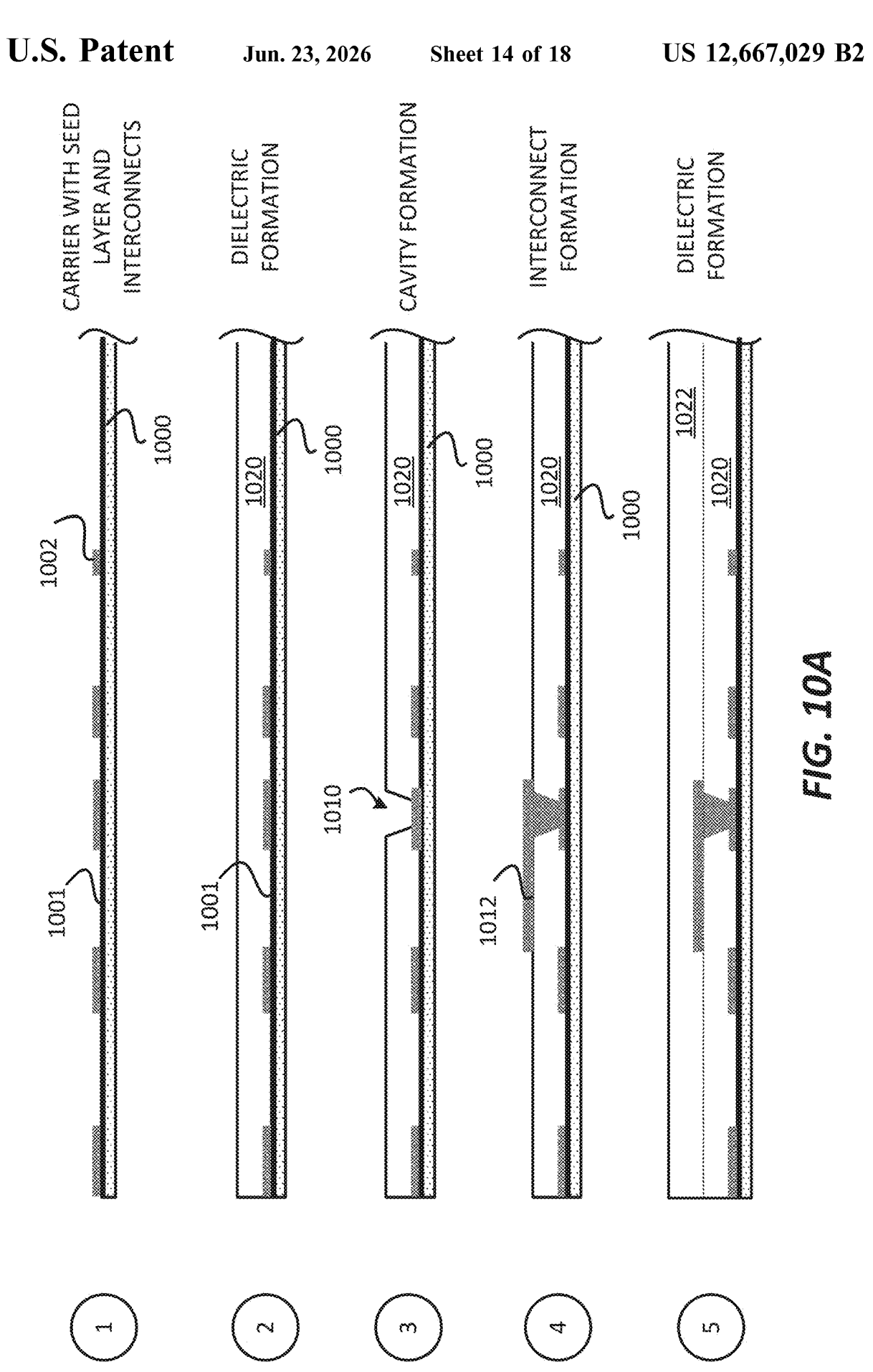
FIGS. 10A-10C illustrate an exemplary sequence for fabricating a substrate that includes post interconnects and a solder resist layer with a cavity.
Figure 10B:
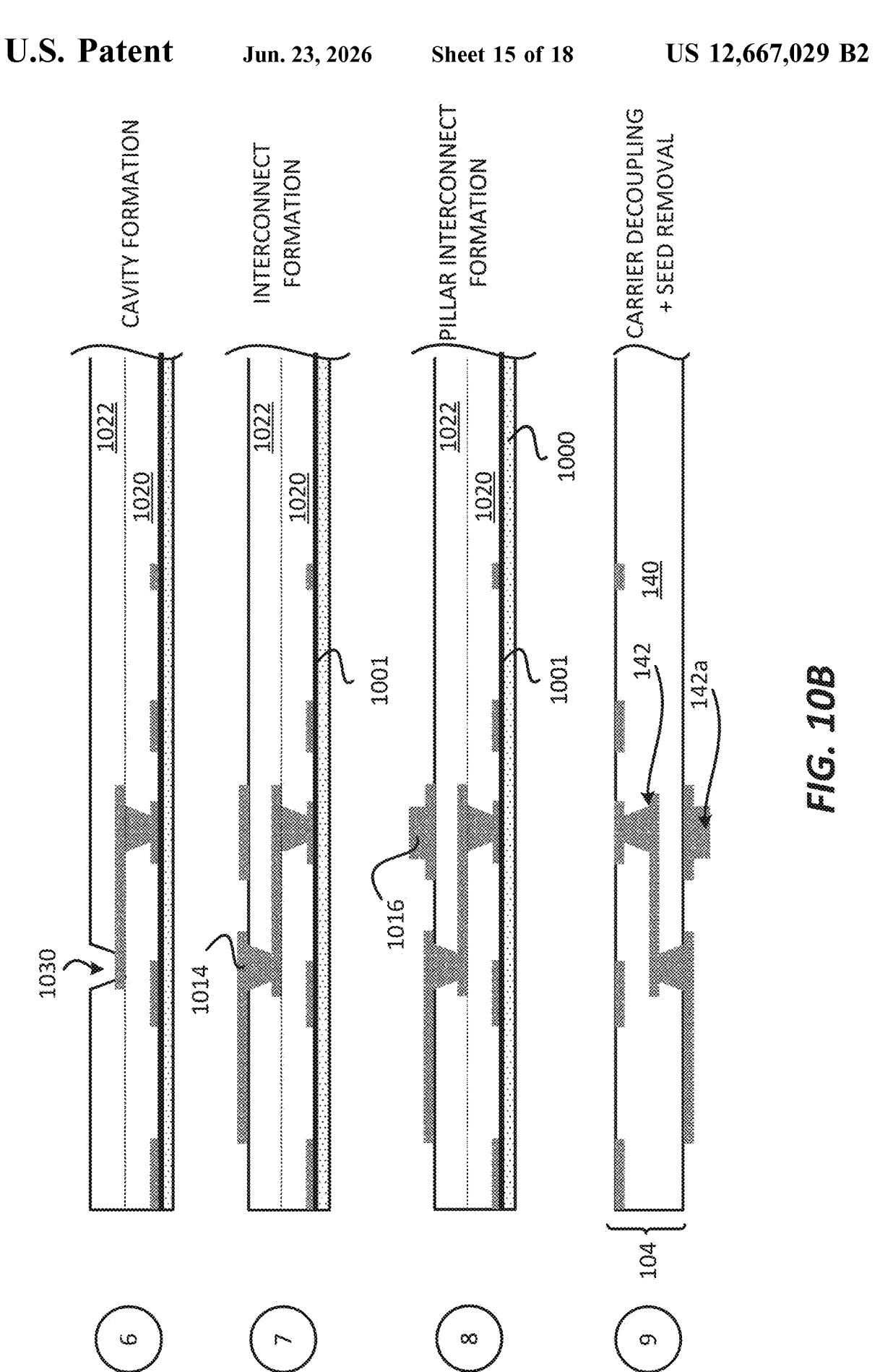
Figure 10C:
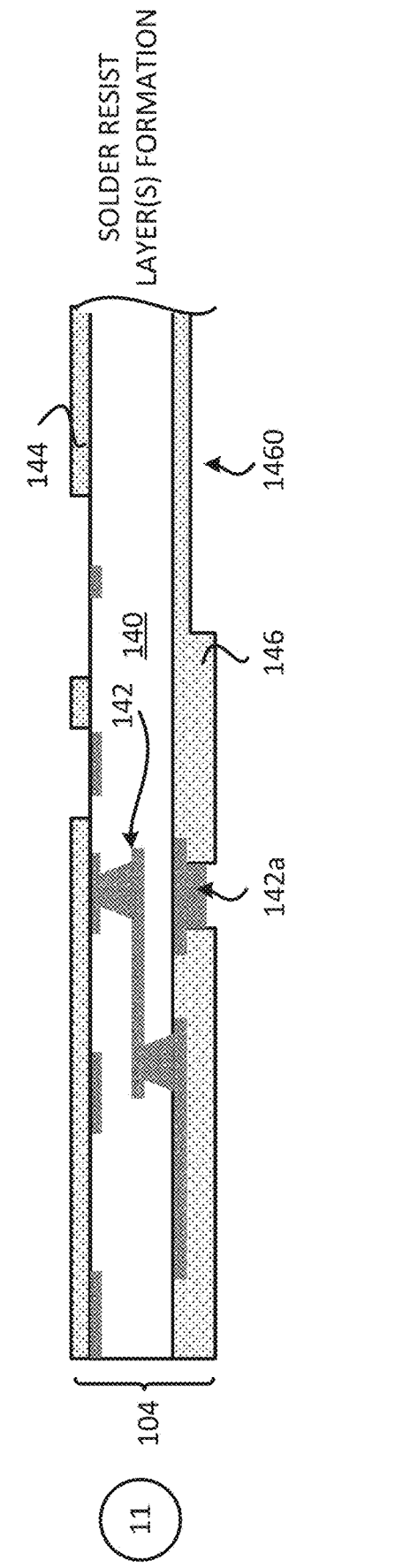

In some implementations, fabricating a substrate includes several processes. FIGS. 10A-10C illustrate an exemplary sequence for providing or fabricating a substrate. In some implementations, the sequence of FIGS. 10A-10C may be used to provide or fabricate the substrate 104. However, the process of FIGS. 10A-10C may be used to fabricate any of the substrates described in the disclosure, such as the substrate 102 and/or the substrate 302.

It should be noted that the sequence of FIGS. 10A-10C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 10A, illustrates a state after a carrier 1000 is provided. A seed layer 1001 and interconnects 1002 may be located over the carrier 1000. The interconnects 1002 may be located over the seed layer 1001, A plating process and etching process may be used to form the interconnects 1002. In some implementations, the carrier 1000 may be provided with the seed layer 1001 and a metal layer that is patterned to form the interconnects 1002. The interconnects 1002 may represent at least some of the interconnects from the plurality of interconnects 142.

Stage 2 illustrates a state after a dielectric layer 1020 is formed over the carrier 1000, the seed layer 1001 and the interconnects 1002. A deposition and/or lamination process may be used to form the dielectric layer 1020. The dielectric layer 1020 may include prepreg and/or polyimide. The dielectric layer 1020 may include a photo-imageable dielectric. However, different implementations may use different materials for the dielectric layer.

Stage 3 illustrates a state after a plurality of cavities 1010 is formed in the dielectric layer 1020. The plurality of cavities 1010 may be formed using an etching process (e.g., photo etching process) or laser process.

Stage 4 illustrates a state after interconnects 1012 are formed in and over the dielectric layer 1020, including in and over the plurality of cavities 1010. For example, a. via, pad and/or traces may be formed. A plating process may be used to form the interconnects.

Stage 5 illustrates a state after a dielectric layer 1022 is formed over the dielectric layer 1020 and the interconnects 1012. A deposition and/or lamination process may be used to form the dielectric layer 1022. The dielectric layer 1022 may include prepreg and/or polyimide. The dielectric layer 1022 may include a photo-imageable dielectric. However, different implementations may use different materials for the dielectric layer.

Stage 6, as shown in FIG. 10B, illustrates a state after a plurality of cavities 1030 is formed in the dielectric layer 1022. The plurality of cavities 1030 may be formed using an etching process (e.g., photo etching process) or laser process, Stage 7 illustrates a state after interconnects 1014 are formed in and over the dielectric layer 1022, including in and over the plurality of cavities 1030. For example, a via, pad and/or traces may be formed. A plating process may be used to form the interconnects.

Stage 8 illustrates a state after interconnects 1016 are formed over some interconnects 1014. The interconnects 1016 may be post interconnects. A plating process may be used to form the interconnects 1016. The plurality of interconnects 1002, the plurality of interconnects 1012, and/or the plurality of interconnects 1014 may be represented by the plurality of interconnects 142. The dielectric layer 1020 and/or the dielectric layer 1022 may be represented by the at least one dielectric layer 140. The at least one dielectric layer 140 may include a photo-imageable dielectric. The at least one dielectric layer 140 may include prepreg and/or polyimide.

Stage 9 illustrates a state after the carrier 1000 is decoupled (e.g., detached, removed, grinded out) from at least one dielectric layer 140 and the seed layer 1001.

portions of the seed layer 1001 are removed (e.g., etched out), leaving the substrate 104 that includes at least one dielectric layer 140 and the plurality of interconnects 142.

Stage 10, as shown in FIG. 10C, illustrates a state after the solder resist layer 144 is formed over the first surface of the substrate 104, and after the solder resist layer 146 is formed over the second surface of the substrate 104, A deposition process and/or lamination process may be used to form the solder resist layer 144 and/or the solder resist layer 146.

Stage 11 illustrates a state after an additional layer of solder resist is formed over portions of the solder resist layer 146, which causes different portions of the solder resist layer 146 to have different thicknesses. The additional layer of solder resist is considered part of the solder resist layer 146. The additional layer of solder resist creates a cavity 1460 in the solder resist layer 146. A deposition process and/or lamination process may be used to form the additional solder resist, Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

In some implementations, fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate(s) of the disclosure. For example, the method 1100 of FIG. 11 may be used to fabricate the substrate 104.

It should be noted that the method 1100 of FIG. 11 may combine one or more processes in order to simplify and/or clarify the method for providing or fabricating a substrate. In some implementations, the order of the processes may be changed or modified.

The method provides (at 1105) a carrier (e.g., 1000). Different implementations may use different materials for the carrier 1000. The carrier 1000 may include a seed layer (e.g., 1001). The seed layer 1001 may include a metal (e.g., copper). The carrier may include a substrate, glass, quartz and/or carrier tape. Stage 1 of FIG. 10A illustrates and describes an example of a carrier with a seed layer that is provided, The method forms and patterns (at 1110) interconnects over the carrier 1000 and the seed layer 1001. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 142). Stage 1 of FIG. 10A illustrates and describes an example of forming and patterning interconnects over a seed layer and a carrier.

The method forms (at 1115) a dielectric layer 1020 over the seed layer 1001, the carrier 1000 and. the interconnects 1002. A deposition and/or lamination process may be used to form the dielectric layer 1020. The dielectric layer 1020 may include prepreg and/or polyimide. The dielectric layer 1020 may include a photo-imageable dielectric. Forming the dielectric layer 1020 may also include forming a plurality of cavities (e.g., 1010) in the dielectric layer 1020. The plurality of cavities may be formed using an etching process (e.g., photo etching) or laser process. Stages 2-3 of FIG. 10A illustrate and describe an example of forming a dielectric layer and cavities in the dielectric layer.

The method forms (at 1120) interconnects in and over the dielectric layer. For example, the interconnects 1012 may be formed in and over the dielectric layer 102.0. A plating process may be used to form the interconnects. Forming interconnects may include providing a patterned metal layer over and/or in the dielectric layer. Forming interconnects may also include forming interconnects in cavities of the dielectric layer. Stage 4 of FIG. 10A illustrates and describes an example of forming interconnects in and over a dielectric layer.

The method forms (at 125) a dielectric layer 1022 over the dielectric layer 1020 and the interconnects 1012. A deposition and/or lamination process may be used to form the dielectric layer 1022. The dielectric layer 1022 may include prepreg and/or polyimide. The dielectric layer 1022 may include a photo-imageable dielectric. Forming the dielectric layer 1022 may also include forming a plurality of cavities (e.g., 1030) in the dielectric layer 1022. The plurality of cavities may be formed using an etching process (e.g., photo etching) or laser process. Stages of FIGS. 10A-10B illustrate and describe an example of forming a dielectric layer and cavities in the dielectric layer.

The method forms (at 1130) interconnects in and over the dielectric layer. For example, the interconnects 1014 may be formed in and over the dielectric layer 1022. A plating process may be used to form the interconnects. Forming interconnects may include providing a patterned metal layer over and/or in the dielectric layer. Forming interconnects may also include forming interconnects in cavities of the dielectric layer. Forming interconnects may include forming post interconnects. Stages 7-8 of FIG. 10B illustrates and describes an example of forming interconnects in and over a dielectric layer, including forming post interconnects.

The method decouples (at 1135) the carrier (e,g., 1000) from the seed layer (e.g., 1001). The carrier 1000 may be detached and/or grinded off. The method may also remove (at 1135) portions of the seed layer (e.g., 1001). An etching process may be used to remove portions of the seed layer 1001. Stage 9 of FIG. 10B illustrates and describes an example of decoupling a carrier and seed layer removal.

The method may form (at 1140) solder resist layer(s) over the firs surface and/or the second surface of the substrate. For example, a first solder resist layer may be formed over a first surface of the substrate, and/or a second solder resist layer may be formed over a second surface of the substrate. The first solder resist layer and/or the second solder resist layer may each have variable thickness such that the first solder resist layer and/or the second solder resist layer may have a cavity, as described in FIGS. 1-4. That is a first portion of a solder resist layer may have a first thickness and a second portion of the same solder resist layer may have a second thickness that is different than the first thickness. Stages 10 and 11 of FIG. 10C illustrate and describe an example of providing and/or forming solder resist layers with a cavity, Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

Figure 12:
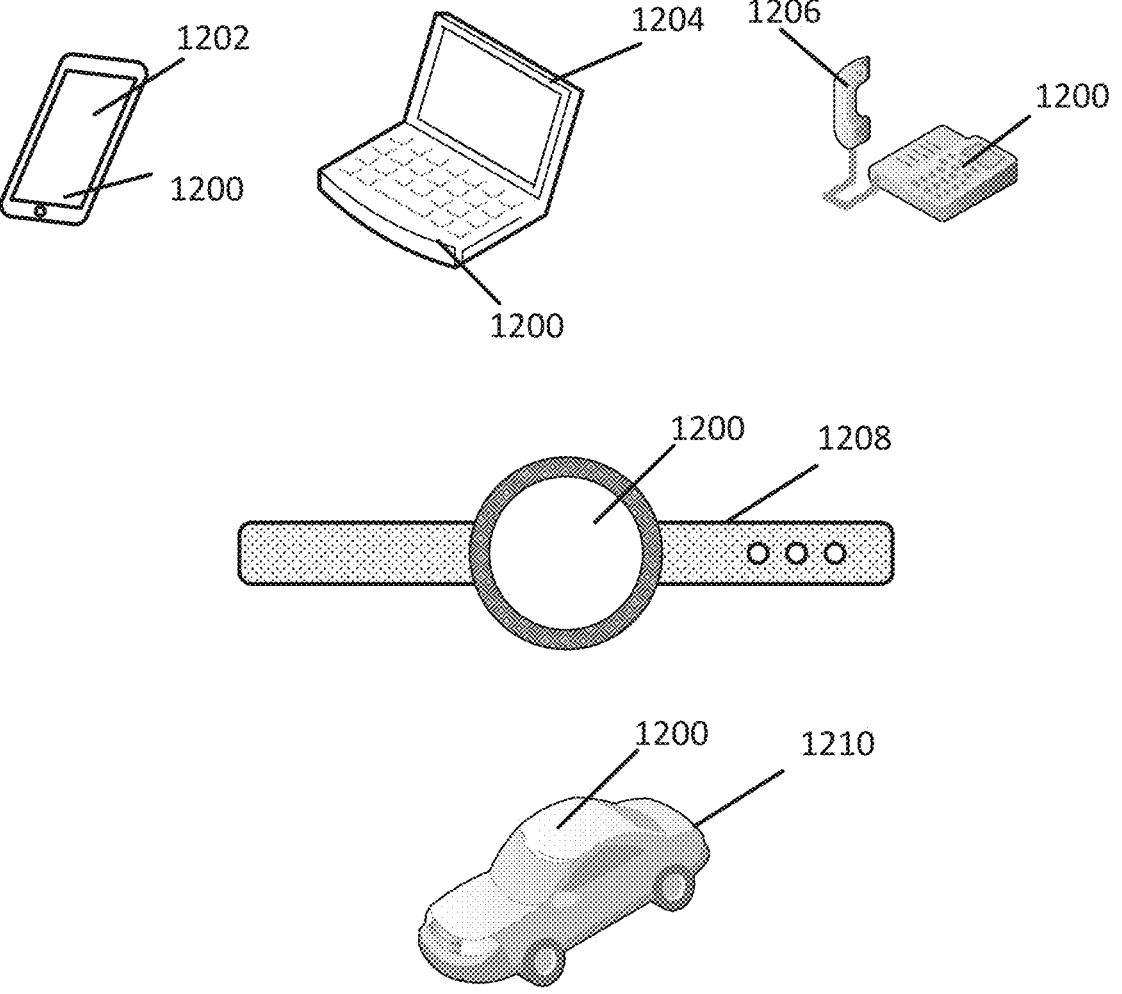
FIG. 12 illustrates various electronic devices that may integrate a die, an electronic circuit, an integrated device, an integrated passive device (IPU), a passive component, a package, and/or a device package described herein.

FIG. 12 illustrates various electronic devices that may be integrated wide any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1202, a laptop computer device 1204, a fixed location terminal device 1206, a wearable device 1208, or automotive vehicle 1210 may include a device 1200 as described herein. The device 1200 may be, for example, any of the devices and/or integrated circuit (IC) packages described herein. The devices 1202, 1204, 1206 and 1208 and the vehicle 1210 illustrated in FIG. 12 are merely exemplary. Other electronic devices may also feature the device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-4, 5A-5C, 6A-6C, 7-9, 10A-1007 and 11-12 may be rearranged and/or combined into a single component, process, feature or function or embodied in several components, processes, or functions. Additional elements, components, processes, and/or functions may also be added without departing from the disclosure. It should also be noted FIGS. 1-4, 5A-5C, 6A-6C, 7-9, 10A-10C and 11-12 and its corresponding description in the present disclosure is not limited to dies and/or ICs. In some implementations, FIGS. 1-4, 5A-5C, 6A-6C, 7-9, 10A-10C and 11-12 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may he exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects, For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom, A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component. where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a. trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD)

process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a first substrate comprising at least one first dielectric layer and a first plurality of interconnects; a first integrated device coupled to the first substrate; a second substrate; and a plurality of ball interconnects and a plurality of solder interconnects coupled to the first substrate and the second substrate. The second substrate comprises a first surface and a second surface; at least one second dielectric layer; a second plurality of interconnects, wherein the second plurality of interconnects comprises a plurality of post interconnects; and a solder resist layer coupled to the second surface of the second substrate. The second surface of the second substrate faces the first substrate. The solder resist layer includes a cavity. The cavity is located between the first integrated device and the solder resist layer. The plurality of ball interconnects and the plurality of solder interconnects are located between the first substrate and the second substrate. The plurality of ball interconnects and the plurality of solder interconnects are configured to couple the first substrate to the second substrate.

Aspect 2: The package of claim 1, wherein the plurality of ball interconnects and the plurality of solder interconnects are coupled to the plurality of post interconnects of the second substrate, and wherein the plurality of post interconnects are laterally surrounded by the solder resist layer.

Aspect 3: The package of aspects 1 through 2, wherein the plurality of ball interconnects include neighboring ball interconnects that have a pitch that is equal or less than 270 micrometers.

Aspect 4: The package of aspect 3, wherein the plurality of ball interconnects include neighboring ball interconnects that have a pitch that is in a range of about 200-270 micrometers, Aspect 5: The package of aspects 1 through 4, wherein the plurality of balls interconnects include at least 300 ball interconnects that laterally surround the first integrated device, Aspect 6: The package of aspects 1 through 5, further comprising an encapsulation layer located between the first substrate and the second substrate, wherein a portion of the encapsulation layer is located between the solder resist layer and the first integrated device.

Aspect 7: The package of aspect 6, wherein the encapsulation layer at least partially encapsulates the first integrated device, the plurality of ball interconnects and the plurality of solder interconnects.

Aspect 8: The package of aspects 1 through 7, wherein the solder resist layer includes a first portion that has a first thickness and a second portion that has a second thickness, wherein the first portion of the solder resist layer has the first thickness that is greater than a thickness of the plurality of post interconnects, wherein the second portion of the solder resist layer has the second thickness that is less than a thickness of the plurality of post interconnects, and wherein the second portion of the solder resist layer is located over the first integrated device.

Aspect 9: The package of aspects 1 through 8, further comprising a second integrated device coupled to the first surface of the second substrate, wherein a vertical gap between the solder resist layer of the second substrate and the back side of the first integrated device is less than another vertical gap between the solder resist layer of the second substrate and a solder resist layer of the first substrate.

Aspect 10: The package of aspects 1 through 9, wherein the plurality of ball interconnects include copper core halls (CCBs).

Aspect 11: A package comprising a first substrate, a first integrated device coupled to the first substrate, and a second substrate, and a plurality of solder interconnects coupled to the first substrate and the second substrate. The first substrate comprises at least one first dielectric layer; a first plurality of interconnects, wherein the first plurality of interconnects include a first plurality of post interconnects; and a first solder resist layer coupled to a first surface of the first substrate. The second substrate comprises a first surface and a second surface; at least one second dielectric layer; a second plurality of interconnects, wherein the second plurality of interconnects comprises a second plurality of post interconnects; and a second solder resist layer coupled to the second surface of the second substrate. The second surface of the second substrate faces the first substrate. The second solder resist layer includes a cavity. The cavity is located between the first integrated device and the second solder resist layer. The plurality of solder interconnects are located between the first substrate and the second substrate. The plurality of solder interconnects are configured to couple the first substrate to the second substrate.

Aspect 12: The package of aspect 11, wherein the plurality of solder interconnects are coupled to (i) the first plurality of post interconnects of the first substrate, and (ii) the second plurality of post interconnects of the second substrate, wherein the first plurality of post interconnects are laterally surrounded by the first solder resist layer, and wherein the second plurality of post interconnects are laterally surrounded by the second solder resist layer.

Aspect 13: The package of aspects 11 through 12, wherein the plurality of solder interconnects include neighboring solder interconnects that have a pitch that is equal or less than 270 micrometers, Aspect 14: The package of aspect 13, wherein the plurality of solder interconnects include neighboring solder interconnects that have a pitch that is in a range of about 150-270 micrometers.

Aspect 15: The package of aspects 11 through 14, wherein the plurality of solder interconnects include at least 300 solder interconnects that laterally surround the first integrated device.

Aspect 16: The package of aspects 11 through 15, further comprising an encapsulation layer located between the first substrate and the second substrate, wherein a portion of the encapsulation layer is located between the second solder resist layer and the first integrated device.

Aspect 17: The package of aspect 16, wherein the encapsulation layer at least partially encapsulates the first integrated device, and the plurality of solder interconnects.

Aspect 18: The package of aspects 11 through 17, wherein the second solder resist layer includes a first portion that has a first thickness and a second portion that has a second thickness, wherein the first portion of the second solder resist layer has the first thickness that is greater than a thickness of the second plurality of post interconnects, wherein the second portion of the second solder resist layer has the second thickness that is less than a thickness of the second plurality of post interconnects, and wherein the second portion of the second solder resist layer is located over the first integrated device.

Aspect 19: The package of aspects 11 through 18, further comprising a second integrated device coupled to the first surface of the second substrate, wherein a vertical gap between the solder resist layer of the second substrate and the hack side of the first integrated device is less than another vertical gap between the solder resist layer of the second substrate and a solder resist layer of the first sub-strate.

Aspect 20: The package of aspects 11 through 19, further comprising a passive device coupled to the first substrate.

Aspect 21: A package comprising a first substrate com-prising at least one first dielectric layer and a first plurality of interconnects; a first integrated device coupled to the first substrate; a second substrate; and means for inter-substrate interconnection coupled to the first substrate and the second substrate. The second substrate comprises a first surface and a second surface; at least one second dielectric layer; a second plurality of interconnects, wherein the second plu-rality of interconnects comprises a plurality of post inter-connects; and a solder resist layer coupled to the second surface of the second substrate. The solder resist layer includes a cavity. The cavity is located between the first integrated device and the solder resist layer. The means for inter-substrate interconnection is located between the first substrate and the second substrate. The means for inter-substrate interconnection is configured to couple the first substrate to the second substrate.

Aspect 22: The package of aspect 21, wherein the means for inter-substrate interconnection includes a plurality of ball interconnects and/or a plurality of solder interconnects.

Aspect 23: The package of aspects 21 through 22, wherein the means for inter-substrate interconnection is coupled to the plurality of post interconnects of the second substrate.

Aspect 24: The package of aspect 23, wherein the first substrate includes a first plurality of interconnects, wherein the first plurality of interconnects comprises a. first plurality of post interconnects, and wherein the means for inter-substrate interconnection is coupled to the first plurality of post interconnects of the first substrate.

Aspect 25: The package of aspects 21 through 24, wherein the means for inter-substrate interconnection includes inter-connects that have a pitch that is in a range of about 150-270 micrometers.

Aspect 26: A method comprising providing a first sub-strate comprising at least one first dielectric layer and a first plurality of interconnects. The method couples a first inte-grated device to the first substrate. The method couples a second substrate to the first substrate through a plurality of inter-substrate interconnects such that the plurality of inter-substrate interconnects is located between the first substrate and the second substrate. The second substrate comprises a first surface and a second surface; at least one second dielectric layer; a second plurality of interconnects, wherein the second plurality of interconnects comprises a plurality of post interconnects; and a solder resist layer coupled to the second surface of the second substrate. The solder resist layer includes a cavity. The cavity is located between the solder resist layer and the first integrated device.

Aspect 27: The method of aspect 26, wherein the plurality of inter-substrate interconnects include a plurality of ball interconnects and/or a plurality of solder interconnects.

Aspect 28: The method of aspects 26 through 27, wherein the plurality of inter-substrate interconnects are coupled to the plurality of post interconnects of the second substrate.

Aspect 29: The method of aspect 28, wherein the first substrate includes a first plurality of interconnects, wherein the first plurality of interconnects comprises a first plurality of post interconnects, and wherein the plurality of inter-substrate interconnects are coupled to the first plurality of post interconnects of the first substrate.

Aspect 30: The method of aspects 26 through 29, wherein the plurality of inter-substrate interconnects include inter-connects that have a pitch that is in a range of about 150-270 micrometers.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and varia-tions will be apparent to those skilled in the art.

The invention claimed is:

1. A package comprising:
   a first substrate comprising:
      at least one first dielectric layer;
      a first plurality of interconnects; and
      a first solder resist layer;
   a first integrated device coupled to the first substrate;
   a second substrate comprising:
      a first surface and a second surface;
      at least one second dielectric layer;
      a second plurality of interconnects, wherein the second plurality of interconnects comprises a plurality of post interconnects; and
      a second solder resist layer coupled to the second surface of the second substrate,
      wherein the second solder resist layer comprises:
         a first solder resist layer portion comprising a first thickness, wherein the first solder resist layer portion vertically overlaps with the first integrated device; and
         a second solder resist layer portion comprising a second thickness that is greater than the first thickness, wherein the second solder resist layer portion is coupled to and touching a side portion of each post interconnect from the plurality of post interconnects,
      wherein the second surface of the second substrate faces in the direction of the first substrate,
      wherein the second solder resist layer includes a cavity, and
      wherein the cavity is located laterally to the second solder resist layer portion and a post interconnect from the plurality of post interconnects,
      wherein the cavity is located vertically between the first integrated device and the second solder resist layer, and
      wherein the second solder resist layer directly touches the at least one second dielectric layer of the second substrate, a plurality of ball interconnects and a plurality of solder interconnects coupled to the first substrate and the second substrate, wherein the plurality of ball interconnects and the plurality of solder interconnects are located between the first substrate and the second substrate, wherein the plurality of ball interconnects and the plurality of solder interconnects are configured to couple the first substrate to the second substrate, and wherein a first solder interconnect from the plurality of solder interconnects directly touches (i) a ball interconnect from the plurality of ball interconnects, (ii) an interconnect from the first plurality of interconnects of the first substrate, (iii) the post interconnect from the plurality of post interconnects of the second substrate, (iv) a first solder resist layer of the first substrate and (v) the second solder resist layer of the second substrate, and an encapsulation layer located between the first substrate and the second substrate, wherein the encapsulation layer directly touches the first solder resist layer of the first substrate and the second solder resist layer of the second substrate, and wherein the encapsulation layer is a different material from the first solder resist layer and the second solder resist layer.

2. The package of claim 1, wherein each post interconnect from the plurality of post interconnects is laterally surrounded by the second solder resist layer, wherein an entire side portion of each post interconnect from the plurality of post interconnects is touched by the second solder resist layer, wherein the post interconnect comprises a thickness and a width, wherein the post interconnect directly touches another interconnect from the second plurality of interconnects of the second substrate, and wherein the thickness of the post interconnect is greater than the width of the post interconnect.

3. The package of claim 1, wherein the plurality of ball interconnects include neighboring ball interconnects that have a pitch that is equal or less than 270 micrometers.

4. The package of claim 3, wherein the plurality of ball interconnects include neighboring ball interconnects that have a pitch that is in a range of about 200-270 micrometers.

5. The package of claim 1, wherein the plurality of balls interconnects include at least 300 ball interconnects that laterally surround the first integrated device.

6. The package of claim 1, wherein a portion of the encapsulation layer is located vertically between the second solder resist layer and the first integrated device, wherein the encapsulation layer is located at least partially in the cavity, wherein the portion of the encapsulation layer that is located vertically between the second solder resist layer and the first integrated device, is located laterally to the second solder resist layer portion and the post interconnect.

7. The package of claim 6, wherein the encapsulation layer at least partially encapsulates the first integrated device, the plurality of ball interconnects and the plurality of solder interconnects.

8. The package of claim 1, further comprising a second integrated device coupled to the first surface of the second substrate, wherein a vertical gap between the second solder resist layer of the second substrate and the back side of the first integrated device is less than another vertical gap between the second solder resist layer of the second substrate and the first solder resist layer of the first substrate.

9. The package of claim 1, wherein the plurality of ball interconnects include copper core balls (CCBs).

10. A package comprising:

a first substrate comprising:

at least one first dielectric layer, a first plurality of interconnects, wherein the first plurality of interconnects comprises a first plurality of post interconnects; and a first solder resist layer;

a first integrated device coupled to the first substrate;

a second substrate comprising:

a first surface and a second surface;

at least one second dielectric layer;

a second plurality of interconnects, wherein the second plurality of interconnects comprises a second plurality of post interconnects; and a second solder resist layer coupled to the second surface of the second substrate, wherein the second solder resist layer comprises:

a first solder resist layer portion comprising a first thickness, wherein the first solder resist layer portion vertically overlaps with the first integrated device; and a second solder resist layer portion comprising a second thickness that is greater than the first thickness, wherein the second solder resist layer portion is coupled to and touching a side portion of each post interconnect from the second plurality of post interconnects, wherein the second solder resist layer includes a cavity, wherein the cavity is located laterally to the second solder resist layer portion and a post interconnect from the plurality of post interconnects, and wherein the cavity is located vertically between the first integrated device and the second solder resist layer, and wherein the second solder resist layer directly touches the at least one second dielectric layer of the second substrate, means for inter-substrate interconnection coupled to the first substrate and the second substrate, wherein the means for inter-substrate interconnection is located between the first substrate and the second substrate, wherein the means for inter-substrate interconnection is configured to couple and directly touch the first plurality of post interconnects of the first substrate and the second plurality of post interconnects of the second substrate, wherein the means for inter-substrate interconnection includes a plurality of ball interconnects and a plurality of solder interconnects, and wherein a first solder interconnect from the plurality of solder interconnects directly touches (i) a first ball interconnect from the plurality of ball interconnects, (ii) a post interconnect from the first plurality of post interconnects of the first substrate, (iii) the post interconnect from the second plurality of post interconnects of the second substrate, (iv) a first solder resist layer of the first substrate and (v) the second solder resist layer of the second substrate.

11. The package of claim 10, wherein the first ball interconnect is the only ball interconnect located vertically between (i) the post interconnect from the first plurality of post interconnects of the first substrate and (ii) the post interconnect from the second plurality of post interconnects of the second substrate.

12. The package of claim 10, wherein an entire side portion of each post interconnect from the plurality of post interconnects is touched by the second solder resist layer, wherein the post interconnect from the second plurality of post interconnects of the second substrate, comprises a thickness and a width, wherein the post interconnect directly touches another interconnect from the second plurality of interconnects of the second substrate and wherein the thickness of the post interconnect from the second plurality of post interconnects of the second substrate, is greater than the width of the post interconnect.

13. The package of claim 10, wherein the means for inter-substrate interconnection includes interconnects that have a pitch that is in a range of about 150-270 micrometers.

14. The package of claim 10, further comprising an encapsulation layer located at least partially in the cavity of the second solder resist layer, wherein the encapsulation layer directly touches the first solder resist layer of the first substrate and the second solder resist layer of the second substrate, and wherein the encapsulation layer is a different material from the first solder resist layer and the second solder resist layer.

15. The package of claim 14, wherein a portion of the encapsulation layer that is located vertically between the second solder resist layer and the first integrated device, is located laterally to the second solder resist layer portion and the post interconnect from the second plurality of post interconnects.

16. The package of claim 15, wherein the encapsulation layer is a single encapsulation layer that is the only encapsulation layer located between the first substrate and the second substrate.

17. The package of claim 16, wherein the encapsulation layer directly touches the second solder resist layer and the first integrated device.

18. The package of claim 6, wherein the encapsulation layer is a single encapsulation layer that directly touches the second solder resist layer and the first integrated device, wherein the single encapsulation layer is the only encapsulation layer located between the first substrate and the second substrate.

* * * * *